United States Patent
Sakaguchi et al.

(10) Patent No.: US 7,910,973 B2
(45) Date of Patent: Mar. 22, 2011

(54) SEMICONDUCTOR STORAGE DEVICE

(75) Inventors: Takeshi Sakaguchi, Kawasaki (JP); Hiroyuki Nitsuta, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 12/404,804

(22) Filed: Mar. 16, 2009

(65) Prior Publication Data
US 2009/0230449 A1 Sep. 17, 2009

(30) Foreign Application Priority Data

Mar. 17, 2008 (JP) .................. 2008-067544
Mar. 18, 2008 (JP) .................. 2008-068745

(51) Int. Cl.
 *H01L 27/108* (2006.01)
 *H01L 29/94* (2006.01)
(52) U.S. Cl. . 257/298; 257/324; 257/326; 257/E29.309; 257/E27.081; 257/306
(58) Field of Classification Search .................. 257/298, 257/306, 307, 324, 326, E29.309, E27.081, 257/E27.071, 379, 381, 535, 536; 438/238, 438/239, 253
See application file for complete search history.

(56) References Cited

U.S. PATENT DOCUMENTS

| | | | |
|---|---|---|---|
| 5,599,724 A | 2/1997 | Yoshida | |
| 5,707,885 A | 1/1998 | Lim | |
| 7,511,939 B2 * | 3/2009 | Wilson et al. | 361/306.2 |
| 7,795,660 B2 * | 9/2010 | Mauder et al. | 257/301 |
| 2007/0158736 A1 | 7/2007 | Arai et al. | |
| 2007/0252201 A1 | 11/2007 | Kito et al. | |
| 2008/0073635 A1 | 3/2008 | Kiyotoshi et al. | |
| 2008/0128780 A1 | 6/2008 | Nishihara et al. | |
| 2008/0173928 A1 * | 7/2008 | Arai et al. | 257/316 |
| 2009/0121271 A1 * | 5/2009 | Son et al. | 257/315 |

FOREIGN PATENT DOCUMENTS

| | | |
|---|---|---|
| JP | 6-338602 | 12/1994 |
| JP | 8-264721 | 10/1996 |
| JP | 10-32269 | 2/1998 |

(Continued)

OTHER PUBLICATIONS

H. Tanaka et al. "Bit Cost Scalable Technology with Punch and Plug Process for Ultra High Density Flash Memory", 2007 Symposium on VLSI Technology Digest of Technical Papers, pp. 14-15.

*Primary Examiner* — Victor Mandala
*Assistant Examiner* — Scott Stowe
(74) *Attorney, Agent, or Firm* — Oblon, Spivak, McClelland, Maier & Neustadt, L.L.P.

(57) ABSTRACT

A non-volatile semiconductor storage device has: a plurality of memory strings with a plurality of electrically rewritable memory cells connected in series; and a capacitor element area including capacitor elements. Each of the memory strings includes: a plurality of first conductive layers laminated on a substrate; and a plurality of first interlayer insulation layers formed between the plurality of first conductive layers. The capacitor element area includes: a plurality of second conductive layers laminated on a substrate and formed in the same layer as the first conductive layers; and a plurality of second interlayer insulation layers formed between the plurality of second conductive layers and formed in the same layer as the first interlayer insulation layers. A group of the adjacently-laminated second conductive layers is connected to a first potential, while another group thereof is connected to a second potential.

18 Claims, 17 Drawing Sheets

FOREIGN PATENT DOCUMENTS

| | | |
|---|---|---|
| JP | 2000-514243 | 10/2000 |
| JP | 2001-320016 | 11/2001 |
| JP | 2002-110825 | 4/2002 |
| JP | 02-141469 | 5/2002 |
| JP | 2004-200504 | 7/2004 |
| JP | 2006-186038 | 7/2006 |
| JP | 2007-266143 | 10/2007 |
| JP | 2007-311566 | 11/2007 |
| JP | 2007-317874 | 12/2007 |
| WO | WO 98/00871 | 1/1998 |

* cited by examiner

SEMICONDUCTOR STORAGE DEVICE

CROSS REFERENCE TO RELATED APPLICATIONS

This application is based on and claims the benefit of priority from prior Japanese Patent Application No. 2008-67544, filed on Mar. 17, 2008, and prior Japanese Patent Application No. 2008-68745, filed on Mar. 18, 2008, the entire contents of which are incorporated herein by reference.

BACKGROUND OF THE INVENTION

1. Field of the Invention

The present invention relates to an electrically rewritable semiconductor storage device.

2. Description of the Related Art

Conventionally, LSIs are formed by integration of devices in a two-dimensional plane on the silicon substrate. Although the dimension for each device must be reduced (refined) to increase memory storage capacity, recent years are facing challenges in such refinement from the viewpoint of cost and technology. Such refinement requires further improvements in photolithography technology. However, in currently available ArF immersion lithography technology, for example, the resolution limit has been reached around the 40 mn design rule and so EUV exposure devices have to be introduced for further refinement. However, the EUV exposure devices are expensive and infeasible in view of the costs. In addition, if such refinement is accomplished, it is assumed that physical improvement limit, such as in breakdown voltage between devices, would be reached unless driving voltage can be scaled. That is, it is likely that difficulties would be encountered in device operation itself.

Therefore, various kinds of semiconductor storage devices have been proposed recently where memory cells are arranged in a three-dimensional manner to achieve improved integration of memory devices.

One of the conventional semiconductor storage devices where memory cells are arranged in a three-dimensional manner uses transistors with a cylinder-type structure (see, Japanese Patent Laid-Open No. 2007-266143, U.S. Pats. No. 5,599,724, and 5,707,885). Those semiconductor storage devices using transistors with the cylinder-type structure are provided with multiple laminated conductive layers corresponding to gate electrodes and pillar-like columnar semiconductors. Each of the columnar semiconductors serves as a channel (body) part of each of the transistors. Memory gate insulation layers that can accumulate charges are provided around the columnar semiconductors. Such a configuration including laminated conductive layers, columnar semiconductors, and memory gate insulation layers is referred to as a "memory string".

In a semiconductor storage device with the memory strings, as in the conventional art, capacitor elements and resistor elements are indispensable. The capacitor elements are used for boosting voltage in a semiconductor storage device or used as protection elements. The resistor elements are used as voltage dividers or used for protecting elements.

Moreover, as in the memory cells, it is required to reduce the areas occupied by the capacitor elements. However, it is necessary to provide capacitor elements with large capacitance for the non-volatile semiconductor storage devices due to high voltage used in writing data, etc. This means that the capacitor elements that are used in a conventional non-volatile semiconductor storage device occupy larger areas compared to other semiconductor devices.

In addition, the resistor elements have been formed with low-resistance floating gates in planar-type transistors. Therefore, when resistor elements with high resistance are required, such floating gates are used that are elongated on the substrate surface, which could hinder the reduction in size of the semiconductor storage devices.

SUMMARY OF THE INVENTION

One aspect of the present invention provides a semiconductor storage device comprising a plurality of memory strings with a plurality of electrically rewritable memory cells connected in series, and a capacitor element area including a capacitor element, each of the memory strings comprising: a plurality of first conductive layers laminated on a substrate; a plurality of first interlayer insulation layers formed between the plurality of first conductive layers; a semiconductor layer formed to penetrate the plurality of first conductive layers and the plurality of first interlayer insulation layers; and a charge accumulation layer formed between the first conductive layers and the semiconductor layer, the capacitor element area comprising: a plurality of second conductive layers laminated on the substrate and formed in the same layer as the first conductive layers; and a plurality of second interlayer insulation layers formed between the plurality of second conductive layers and formed in the same layer as the first interlayer insulation layers, a group of the second conductive layers laminated adjacently to form two layers being connected to a first potential, while another group of the second conductive layers laminated adjacently to form two layers being connected to a second potential different from the first potential, and the second conductive layers laminated adjacently to form two layers and the second interlayer insulation layer between the second conductive layers configuring the capacitor element.

Another aspect of the present invention provides a semiconductor storage device comprising a plurality of memory strings with a plurality of electrically rewritable memory cells connected in series, and a resistor element area including a resistor element, each of the memory strings comprising: a plurality of first conductive layers laminated on a substrate; a plurality of interlayer insulation layers formed between the plurality of first conductive layers; a semiconductor layer formed to penetrate the plurality of first conductive layers and the plurality of interlayer insulation layers; and a charge accumulation layer formed between the first conductive layers and the semiconductor layer, the resistor element area comprising a plurality of second conductive layers laminated on the substrate and formed in the same layer as the first conductive layers, and at least two layers of the plurality of second conductive layers being connected in series to configure the resistor element.

Still another aspect of the present invention provides a semiconductor storage device comprising a plurality of memory strings with a plurality of electrically rewritable memory cells connected in series, and a capacitive/resistor element area including capacitive or resistor elements, each of the memory strings comprising: a plurality of first conductive layers laminated on a substrate; a plurality of first interlayer insulation layers formed between the plurality of first conductive layers; a semiconductor layer formed to penetrate the plurality of first conductive layers and the plurality of first interlayer insulation layers; and a charge accumulation layer formed between the first conductive layers and the semiconductor layer, the capacitor/resistor element area comprising: a plurality of second conductive layers laminated on the substrate and formed in the same layer as the first conductive layers; and a plurality of second interlayer insulation layers formed between the plurality of second conductive layers and formed in the same layer as the first interlayer insulation layers.

DETAILED DESCRIPTION OF THE EMBODIMENTS

Embodiments of a non-volatile semiconductor storage device according to the present invention will now be described below with reference to the accompanying drawings.

First Embodiment (Configuration of Non-Volatile Semiconductor Storage Device 100 in First Embodiment)

Figure 1:
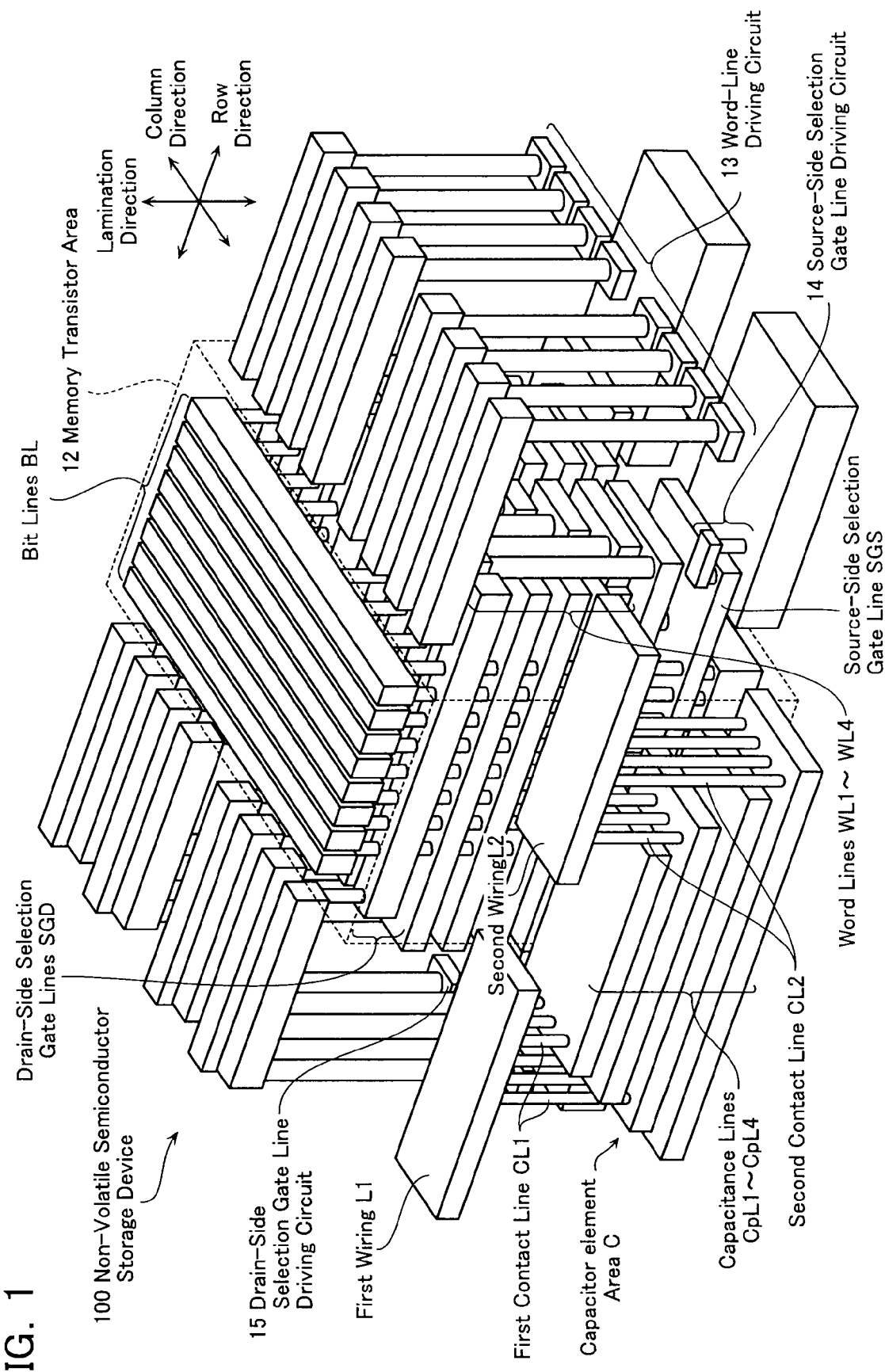
FIG. 1 is a schematic diagram illustrating a configuration of a non-volatile semiconductor storage device 100 according to a first embodiment of the present invention.

FIG. 1 schematically illustrates a non-volatile semiconductor storage device 100 according to a first embodiment of the present invention. As illustrated in FIG. 1, the non-volatile semiconductor storage device 100 according to the first embodiment mainly comprises: a memory transistor area 12; a word-line driving circuit 13; a source-side selection gate line (SGS) driving circuit 14; a drain-side selection gate line (SGD) driving circuit 15; a sense amplifier (not illustrated); and a capacitor element area C.

The memory transistor area 12 has memory transistors for storing data. The word-line driving circuit 13 controls voltage applied to word lines (first conductive layers) WL. The source-side selection gate line (SGS) driving circuit 14 controls voltage applied to the source-side selection gate line SGS. The drain-side selection gate line (SGD) driving circuit 15 controls voltage applied to drain-side selection gate lines (SGD).

The sense amplifier amplifies a potential read from a memory transistor. The capacitor element area C includes capacitor elements that are used for boosting voltage to drive the non-volatile semiconductor storage device 100, or used as a protection element. In addition to this, the non-volatile semiconductor storage device 100 according to the first embodiment comprises a bit-line driving circuit for controlling voltage applied to bit lines BL and a source-line driving circuit for controlling voltage applied to source lines SL (not illustrated).

In addition, as illustrated in FIG. 1, in the non-volatile semiconductor storage device 100 according to the first embodiment, the memory transistors included in the memory transistor area 12 are formed by lamination of a plurality of semiconductor layers.

Figure 2:
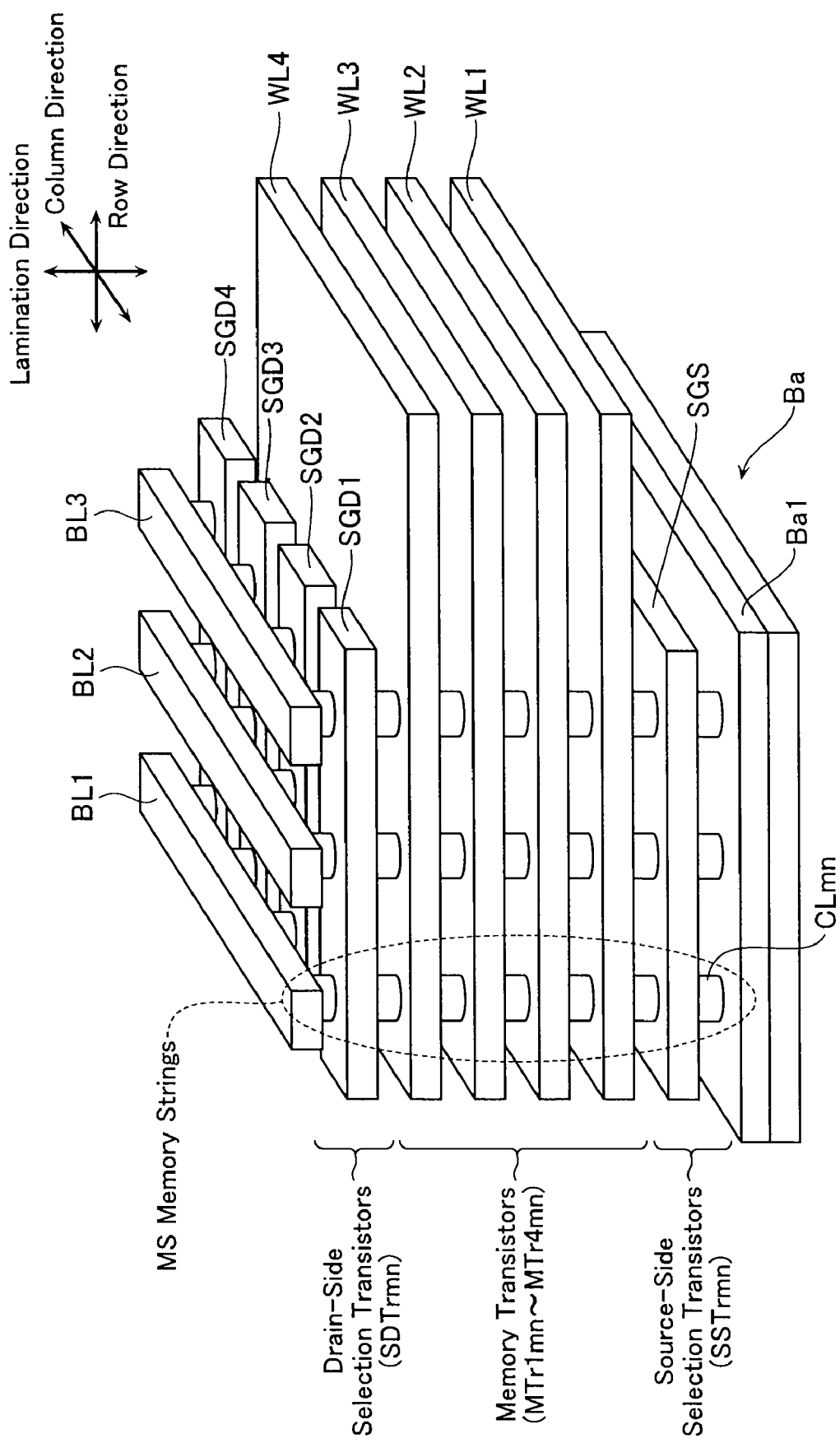
FIG. 2 is a perspective view schematically illustrating a part of the memory transistor area 12 in the non-volatile semiconductor storage device 100 according to the first embodiment of the present invention.

FIG. 2 is a perspective view schematically illustrating a part of the memory transistor area 12 in the non-volatile semiconductor storage device 100 according to the first embodiment. According to the first embodiment, the memory transistor area 12 has m×n (where m and n are natural numbers) memory strings MS including memory transistors (MTr1mn to MTr4mn) as well as a source-side selection transistor SSTrmn and drain-side selection transistors SDTrmn. Here, the number of bit lines BL is defined as n, and the number of drain side selection gate lines SGD is defined as m. In FIG. 2, given that m=3, n=4.

In each of the memory strings MS, each of word lines WL1 to WL4 connected to the gate of each of the memory transistors MTr1mn to MTr4mn is formed by the same conductive layer via an interlayer insulation layer (first interlayer insulation layer) and used in common therein. That is, in each of the memory strings MS, all gates of the memory transistor MTr1mn are connected to the word line WL1. In addition, in each of the memory strings MS, all gates of the memory transistor MTr2mn are connected to the word line WL2. In addition, in each of the memory strings MS, all gates of the memory transistor MTr3mn are connected to the word line WL3. In addition, in each of the memory strings MS, all gates of the memory transistor MTr4mn are connected to the word line WL4. As illustrated in FIGS. 1 and 2, in the non-volatile semiconductor storage device 100 according to the first embodiment, each of the word lines WL1 to WL4 is formed to expand in a two-dimensional manner in a horizontal direction parallel to the semiconductor substrate Ba. In addition, the word lines WL1 to WL4 are arranged substantially vertical to the respective memory strings MS. In addition, the row-direction ends of the word lines WL1 to WL4 are formed in a stepwise manner in relation to each other. Wherein, the row direction represents a direction orthogonal to the vertical direction and the column direction represents another orthogonal to the vertical direction and the row direction.

Each of the memory strings MS has columnar semiconductors CLmn (in the case of FIG. 2, m=1 to 3, n=1 to 4) provided on an n+ area (i.e., Ba2, as described below) that is formed on a P-well area Ba1 on a semiconductor substrate Ba. The columnar semiconductors CLmn are formed in a vertical direction to the principle plane of the semiconductor substrate Ba and arranged in a matrix form on the respective surfaces of the semiconductor substrate Ba and the word lines (WL1 to WL4). That is, the memory strings MS are also arranged in a matrix form within a plane vertical to the columnar semiconductors CLmn. Note that the columnar semiconductors CLmn may be columnar or prismatic in shape. In addition, the columnar semiconductors CLmn include terraced columnar semiconductors.

Further, as illustrated in FIG. 2, provided on the upper portions of the memory strings MS are drain-side selection gate lines SGD with rectangular plate shapes (in the case of FIG. 2, SGD1 to SGD4), which contact columnar semiconductors CLmn via insulation layers (not illustrated) and are included in respective drain-side selection transistors SDTrmn. The drain-side selection gate lines SGD are insulated and isolated from each other and formed in lines extending in the row direction and repeatedly provided in the column direction. This is different from the word lines WL1 to WL4. In addition, columnar semiconductors CLmn are provided to penetrate the center in the column direction of the drain-side selection gate lines SGD.

Further, as illustrated in FIG. 2, provided on the lower portions of the memory strings MS is a source-side selection gate line SGS, which contacts the columnar semiconductors CLmn via insulation layers (not illustrated) and is included in a source-side selection transistor SSTrmn. As with the word lines WL1 to WL4, the source-side selection gate line SGS is formed to expand in a two-dimensional manner in the horizontal direction. Note that, in addition to the structure as illustrated in FIG. 2, the source-side selection gate line SGS may be formed in strip shape extending in the row direction and repeatedly provided in the column direction.

Figure 3:
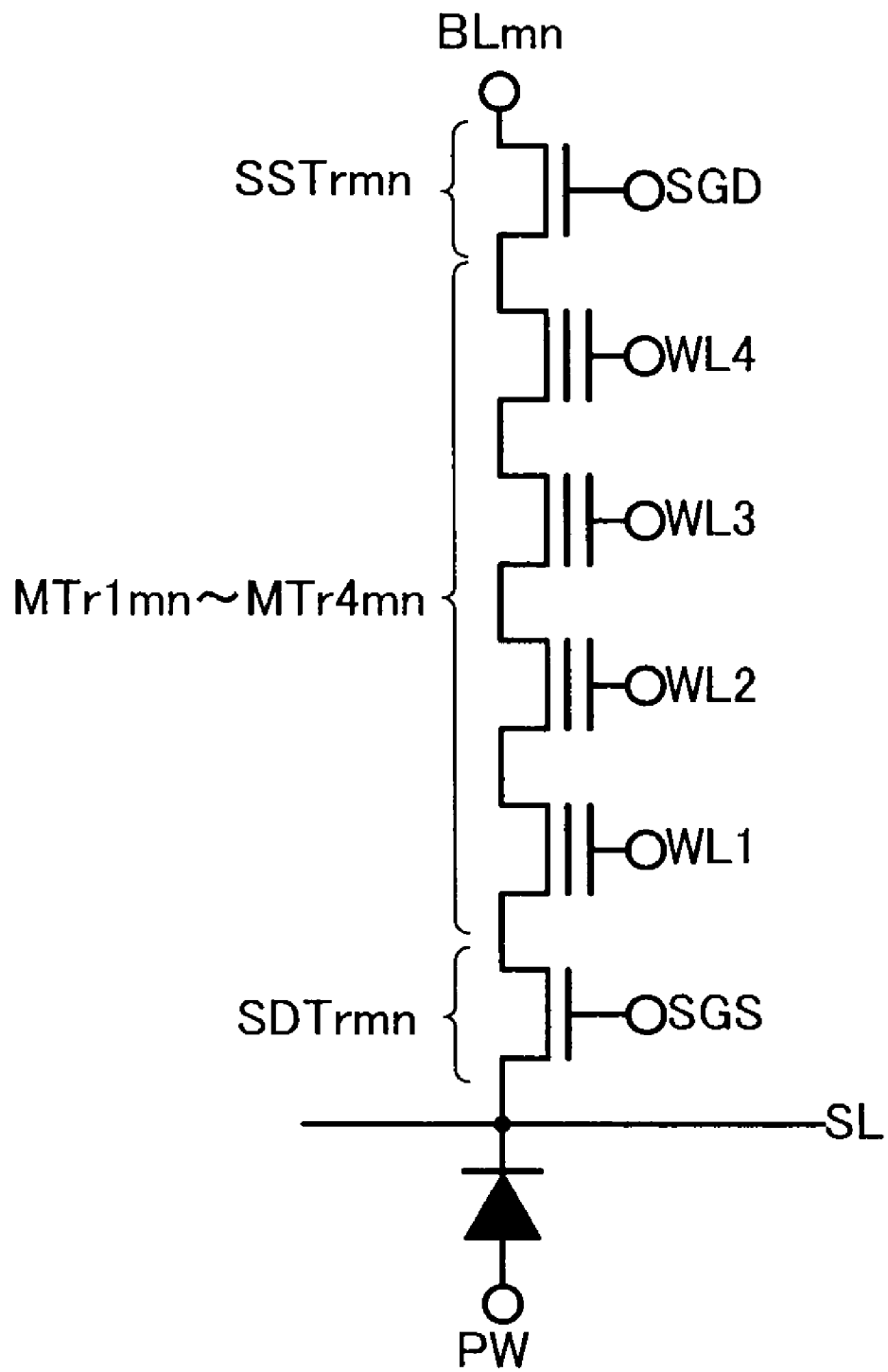
FIG. 3 is a circuit diagram illustrating one memory string MS according to the first embodiment of the present invention.

Referring now to FIGS. 2 and 3, the circuit configuration and operation of the memory strings MS of the first embodiment will be described below. FIG. 3 is a circuit diagram illustrating one memory string MS according to the first embodiment.

As illustrated in FIGS. 2 and 3, in the first embodiment, each of the memory strings MS has four memory transistors MTr1mn to MTr4mn as well as the source-side selection transistor SSTrmn and the drain-side selection transistor SDTrmn. These four memory transistors MTr1mn to MTr4mn as well as the source-side selection transistor SSTrmn and the drain-side selection transistor SDTrmn are connected in series to each other (see FIG. 3). According to the first embodiment, in each of the memory strings MS, a columnar semiconductor CLmn is formed on an n+ area that is formed on the p− type area (P-well area) Ba1 on the semiconductor substrate Ba.

In addition, a source line SL (an n+ area formed on the P-well area Ba1 on the semiconductor substrate Ba) is connected to the source of each source-side selection transistor SSTrmn. Further, a bit line BL is connected to the drain of each drain-side selection transistor SDTrmn.

Each of the memory transistors MTrmn has a columnar semiconductor CLmn, a charge accumulation layer formed to surround the columnar semiconductor CLmn, and a word line WL formed to surround the charge accumulation layer. Each word line WL functions as a control gate of the corresponding memory transistor MTrmn.

In the non-volatile semiconductor storage device 100 with the above-mentioned configuration, respective voltages of the bit lines BL1 to BL3, the drain-side selection gate lines SGD, the word lines WL1 to WL4, the source-side selection gate line SGS, and the source lines SL are controlled by bit line driving circuits (not illustrated), the drain-side selection gate line driving circuit 15, the word line driving circuits 13, the source-side selection gate line driving circuit 14, and a source line driving circuit (not illustrated). That is, data is read, written and erased by controlling charges of the charge accumulation layer in a predetermined memory transistor MTrmn.

Figure 4:
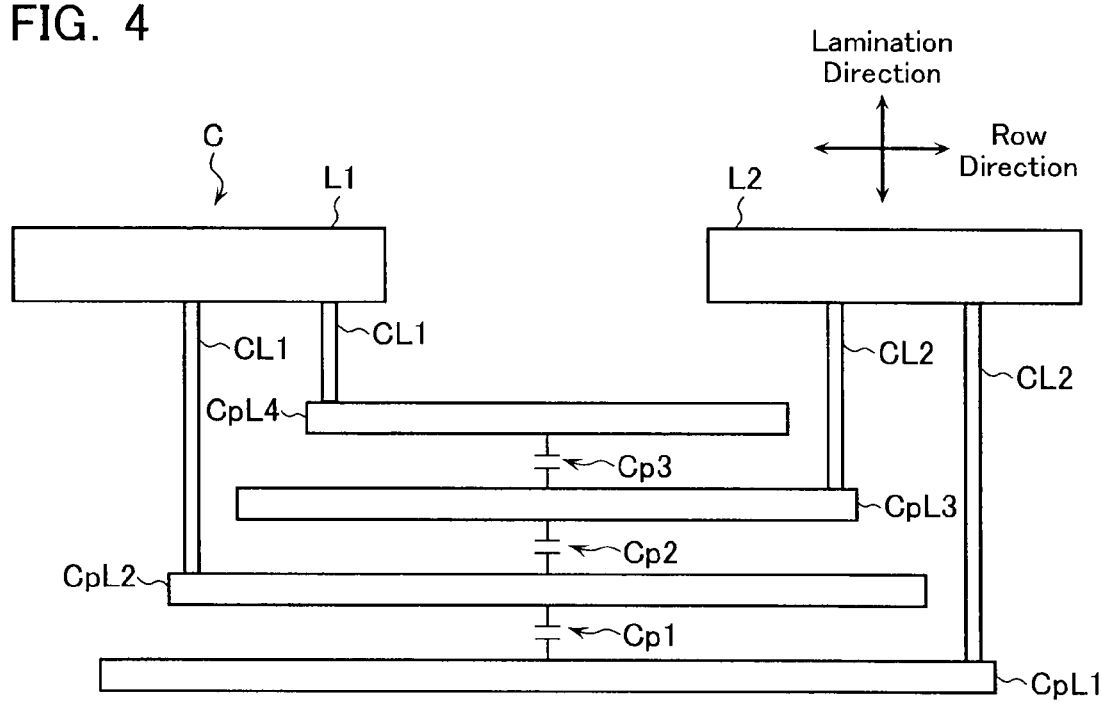
FIG. 4 is a schematic cross-sectional view illustrating a part of a capacitor element area C in the non-volatile semiconductor storage device 100 of the first embodiment.
Figure 5:
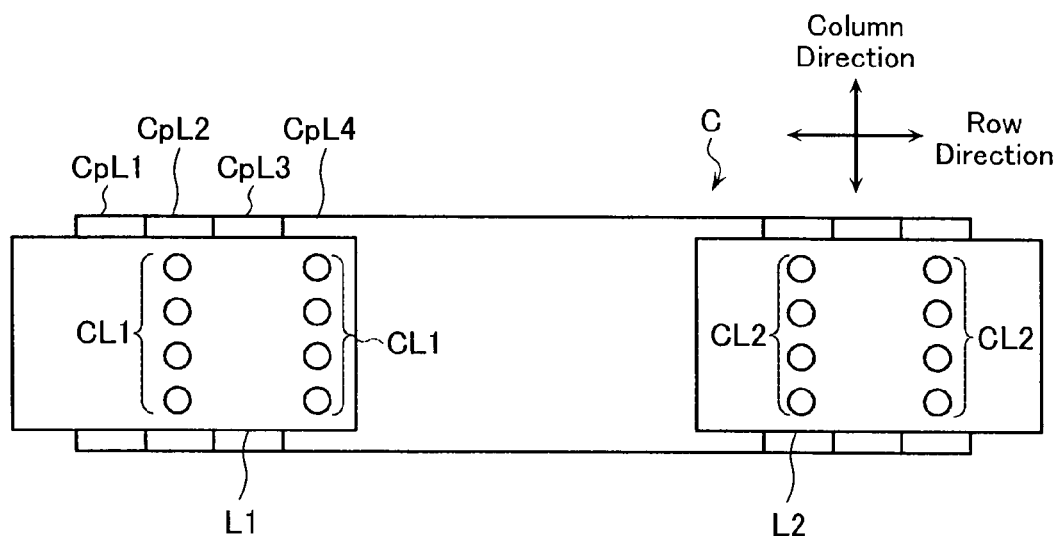
FIG. 5 is a schematic top plan view illustrating a part of the capacitor element area C in the non-volatile semiconductor storage device 100 of the first embodiment.

Referring now to FIGS. 4 and 5, a configuration of the capacitor element area C will be described below. FIG. 4 is a schematic cross-sectional view illustrating a part of the capacitor element area C; and FIG. 5 is a top plan view thereof. The capacitor element area C has capacitance lines (second conductive layers) CpL1 to CpL4 expanding in the row and column directions, plural first and second contact lines CL1 and CL2 connected to the respective capacitance lines CpL1 to CpL4 and extending upward therefrom, and first and second wirings L1 ad L2 connected to the upper ends of the first and second contact lines CL1 and CL2. Here, the plural first contact lines CL1 are commonly connected to the first wiring L1, and the plural second contact lines CL2 are commonly connected to the second wiring L2.

The capacitance lines CpL1 to CpL4 are laminated one above the other via respective interlayer insulation layers (second interlayer insulation layers). The capacitance lines CpL1 to CpL4 have their row-direction ends formed in a stepwise manner in relation to one another.

The first contact lines CL1 are connected to the row-direction end of the second lowest capacitance line CpL2. In addition, the first contact lines CL1 are connected to the row-direction end of the fourth lowest capacitance line CpL4. Also, the plural first contact lines CL1 are arranged along the column direction on the capacitance lines CpL2 and CpL4.

The second contact lines CL2 are connected to the row-direction end of the lowest capacitance line CpL1. In addition, the second contact lines CL2 are connected to the row-direction end of the third lowest capacitance line CpL3. Also, the plural second contact lines CL2 are arranged along the column direction on the capacitance lines CpL1 and CpL3.

The first wiring L1 is connected to the upper ends of the first contact lines CL1. The first wiring L1 is connected to a predetermined potential. Thus, the capacitance lines CpL2 and CpL4 are connected to the predetermined potential via the first contact lines CL1. In this case, for example, the predetermined potential is 2.5V.

The second wiring L2 is connected to the upper ends of the second contact lines CL2. The second wiring L2 is connected to the ground potential. Thus, the capacitance lines CpL1 and CpL3 are connected to the ground potential via the second contact lines CL2.

With this configuration, a capacitor element Cp1 is provided that has the capacitance lines CpL1 and CpL2 as upper and lower electrodes, and an interlayer insulation layer between the capacitance lines CpL1 and CpL2 as a dielectric film. A capacitor element Cp2 is also provided that has the capacitance lines CpL2 and CpL3 as upper and lower electrodes, and an interlayer insulation layer between the capacitance lines CpL2 and CpL3 as a dielectric film. A capacitor element Cp3 is also provided that has the capacitance lines CpL3 and CpL4 as upper and lower electrodes, and an interlayer insulation layer between the capacitance lines CpL3 and CpL4 as a dielectric film.

That is, in this case, four layers of capacitance lines CpL are provided, the first contact lines CL1 are connected to the even-numbered, counted from bottom, capacitance lines CpL2 and CpL4, and the second contact lines CL2 are connected to the odd-numbered, counted from bottom, capacitance lines CpL1 and CpL3. If there are M layers of capacitance lines CpL (where M is a natural number not less than 4), then the n+1th capacitance line CpL from the bottommost one (where n is a natural number not less than 0) may be configured to be connected to a first contact line CL1, while the n+2th capacitance line CpL from the bottommost one may be connected to a second contact line CL2.

(Specific Configuration of Non-Volatile Semiconductor Storage Device 100 in First Embodiment)

Figure 6:
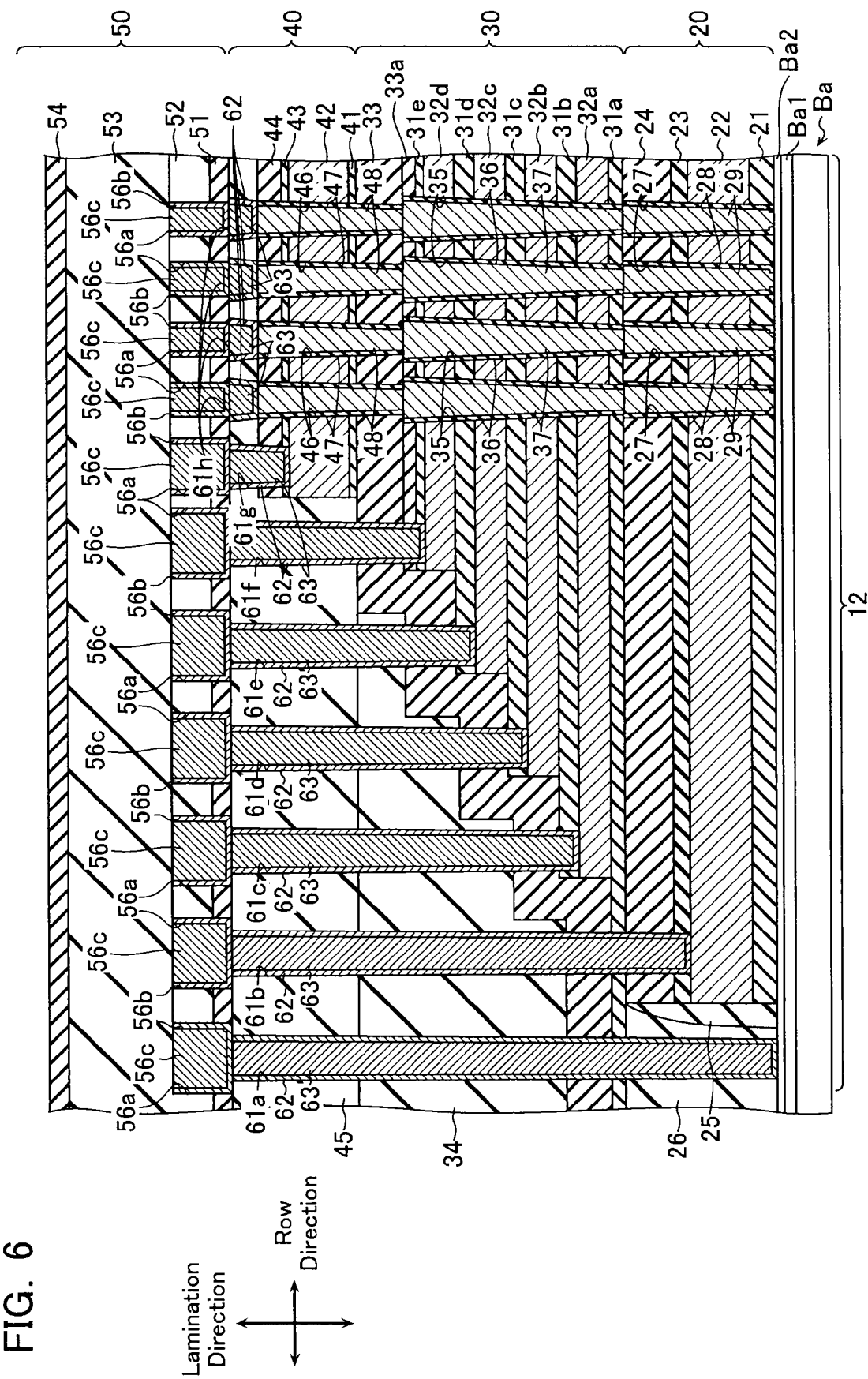
FIG. 6 is a cross-sectional view specifically illustrating the memory transistor area 12 in the non-volatile semiconductor storage device 100 according to the first embodiment.
Figure 7:
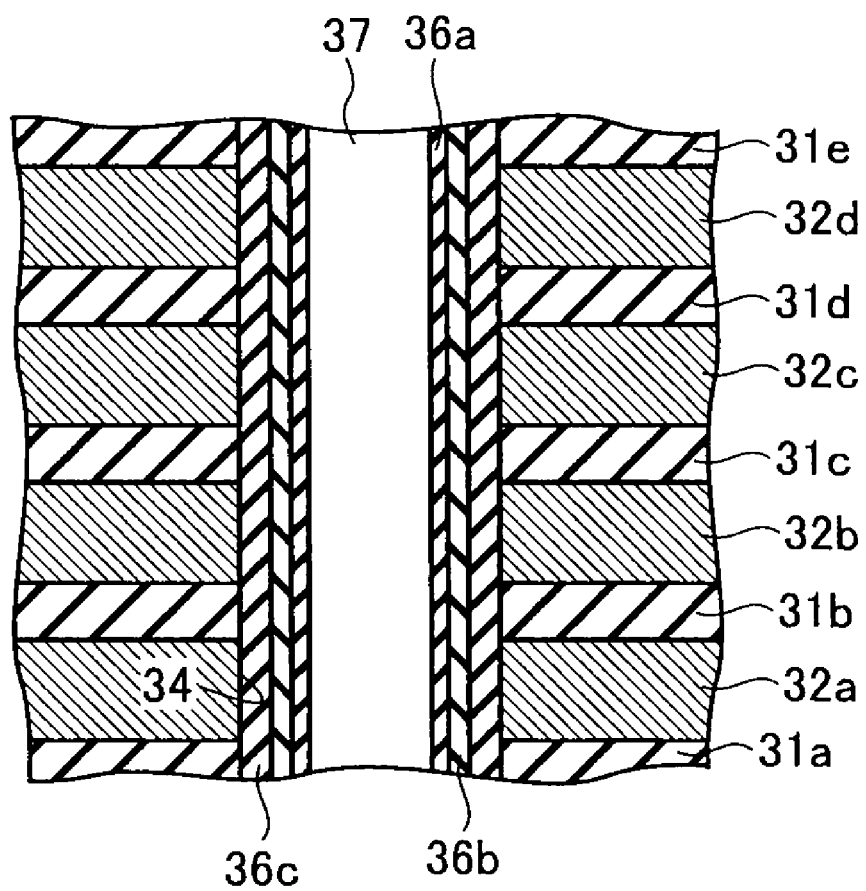
FIG. 7 is a partial enlarged view of FIG. 6.
Figure 8:
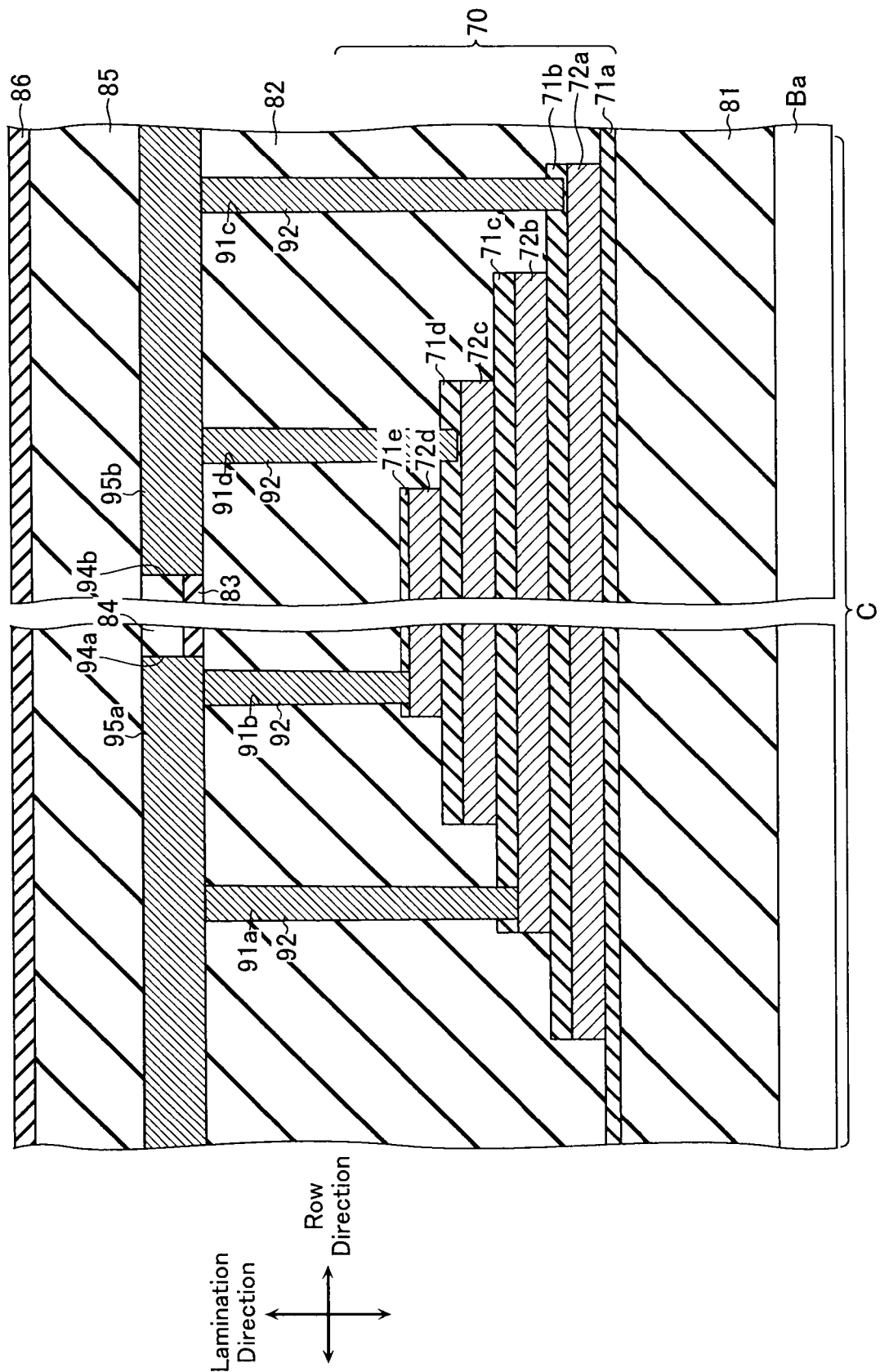
FIG. 8 is a cross-sectional view specifically illustrating the capacitor element area C in the non-volatile semiconductor storage device 100 of the first embodiment.

Referring now to FIGS. 6 to 8, a further specific configuration of the non-volatile semiconductor storage device 100 will be described below. FIG. 6 is a cross-sectional view specifically illustrating the memory transistor area 12 in the non-volatile semiconductor storage device 100 according to the first embodiment; and FIG. 7 is a partial enlarged view of FIG. 6. FIG. 8 is a cross-sectional view specifically illustrating the capacitor element area C in the non-volatile semiconductor storage device 100 of the first embodiment.

Firstly, the memory transistor area 12 is described. As illustrated in FIG. 6, in the memory transistor area 12, the non-volatile semiconductor storage device 100 (one memory string MS) has, from lower layer to upper layer, a source-side selection transistor layer 20, a memory transistor layer 30, a drain-side selection transistor layer 40, and a wiring layer 50 on the semiconductor substrate Ba. The source-side selection transistor layer 20 functions as a source-side selection transistor SSTrmn. The memory transistor layer 30 functions as a memory transistor MTrmn. The drain-side selection transistor layer 40 functions as a drain-side selection transistor SDTrmn.

A p⁻ type area (P-well area) Ba1 is formed on the semiconductor substrate Ba. In addition, an n⁺ area (source-line area) Ba2 is formed on the p⁻ type area Ba1.

The source-side selection transistor layer 20 has a source-side first insulation layer 21, a source-side conductive layer 22, a source-side second insulation layer 23, and a source-side isolation and insulation layer 24 that are sequentially laminated on the semiconductor substrate Ba.

The source-side first insulation layer 21, the source-side conductive layer 22, the source-side second insulation layer 23, and the source-side isolation and insulation layer 24 are each formed to expand in a two-dimensional manner at the memory transistor area 12 in the horizontal direction parallel to the semiconductor substrate Ba. The source-side first insulation layer 21, the source-side conductive layer 22, the source-side second insulation layer 23, and the source-side isolation and insulation layer 24 are arranged separately for each predetermined area (erase unit) in the memory transistor area 12. A sidewall insulation layer 25 is formed on their row- and column-direction ends. In addition, an insulation layer 26 is formed ranging from the top of the semiconductor substrate Ba to the top surface of the source-side isolation and insulation layer 24.

The source-side first insulation layer 21 and the source-side second insulation layer 23 are composed of silicon oxide ($SiO_2$). The source-side conductive layer 22 is composed of p⁺ type polysilicon (p-Si). The source-side isolation and insulation layer 24 is composed of silicon nitride (SiN).

In addition, source-side holes 27 are formed to penetrate the source-side isolation and insulation layer 24, the source-side second insulation layer 23, the source-side conductive layer 22, and the source-side first insulation layer 21. Source-side gate insulation layers 28 and source-side columnar semiconductor layers 29 are sequentially provided on the respective sidewalls facing the source-side holes 27.

The source-side gate insulation layers 28 are formed by silicon oxide ($SiO_2$). The source-side columnar semiconductor layers 29 are formed by polysilicon (p-Si). In addition, the upper portion of the source-side columnar semiconductor layers 29 may be composed of n⁺ type polysilicon.

Note that the configuration of the source-side conductive layer 22 in the source-side selection transistor layer 20 is restated as follows: the source-side conductive layer 22 is formed to sandwich the source-side gate insulation layers 28 with the source-side columnar semiconductor layers 29.

In addition, in the source-side selection transistor layer 20, the source-side conductive layer 22 functions as the source-side selection gate line SGS. In other words, the source-side conductive layer 22 functions as the control gate of the source-side selection transistor SSTrmn.

The memory transistor layer 30 has first to fifth inter-wordline insulation layers (first interlayer insulation layers) 31a to 31e that are provided over the source-side isolation and insulation layer 24 and the insulation layer 26, first to fourth word-line conductive layers (first conductive layers) 32a to 32d that are provided between the first to fifth inter-wordline insulation layers 31a to 31e, as well as a memory isolation and insulation layer 33a and a memory protection insulation layer 33 that are sequentially laminated on the fifth inter-wordline insulation layers 31e.

The first to fifth inter-wordline insulation layers 31a to 31e, the first to fourth word-line conductive layers 32a to 32d, as well as the memory isolation and insulation layer 33a are each formed to expand in a two-dimensional manner at their row and column directions. In addition, they are formed in a stepwise manner in relation to each other at their row-direction ends. The memory protection insulation layer 33 is formed over the first to fifth inter-wordl16, 2006, ine insulation layers 31a to 31e, the first to fourth word-line conductive layers 32a to 32d, as well as the memory isolation and insulation layer 33a, so that it covers their row- and column-direction ends. In addition, an insulation layer 34 is formed in the memory transistor layer 30, ranging from the top of the memory protection insulation layer 33 formed on the top surface of the first insulation layer 31a to the top of the memory protection insulation layer 33 formed on the top surface of the memory isolation and insulation layer 33a.

The first to fifth inter-wordline insulation layers 31a to 31e are composed of silicon oxide ($SiO_2$). The first to fourth word-line conductive layers 32a to 32d are composed of p⁺ type polysilicon (p-Si). The memory isolation and insulation layer 33a and the memory protection insulation layer 33 are composed of silicon nitride (SiN).

In addition, the memory transistor layer 30 has memory holes 35 formed therein so as to penetrate the memory isolation and insulation layer 33a, the first to fifth inter-word line insulation layers 31a to 31e, and the first to fourth word-line conductive layers 32a to 32d. The memory holes 35 are provided at positions matching the source-side holes 27. Memory gate insulation layers 36 and memory columnar semiconductor layers 37 are sequentially provided on the respective sidewalls of the memory holes 35.

Each of the memory gate insulation layers 36 is configured as illustrated in FIG. 7. As illustrated in FIG. 7, each of the memory gate insulation layers 36 has a tunnel insulation layer 36a, a charge accumulation layer 36b for accumulating charges, and a block insulation layer 36c that are sequentially formed on the sidewall of each of the memory columnar semiconductor layers 37.

The tunnel insulation layers 36a and the block insulation layers 36c are formed by silicon oxide ($SiO_2$). The charge accumulation layers 36b are formed by silicon nitride (SiN). The memory columnar semiconductor layers 37 are composed of polysilicon (p-Si). In addition, the upper portions of the memory columnar semiconductor layers 37 may be composed of $n^+$ type polysilicon.

Note that the configuration of the first to fourth word-line conductive layers 32a to 32d in the memory transistor layer 30 is restated as follows: the first to fourth word-line conductive layers 32a to 32d are formed to sandwich the tunnel insulation layers 36a, the charge accumulation layers 36b, and the block insulation layers 36c with the memory columnar semiconductor layers 37.

In addition, in the memory transistor layer 30, the first to fourth word-line conductive layers 32a to 32d function as the word lines WL1 to WL4. In other words, the first to fourth word-line conductive layers 32a to 32d function as the control gates of the memory transistors MTrmn.

The drain-side selection transistor layer 40 has a drain-side first insulation layer 41, a drain-side conductive layer 42, a drain-side second insulation layer 43, and a drain-side isolation and insulation layer 44 that are sequentially laminated on the memory protection insulation layer 33.

The drain-side first insulation layer 41, the drain-side conductive layer 42, the drain-side second insulation layer 43, and the drain-side isolation and insulation layer 44 are provided at positions matching the upper portions of the memory columnar semiconductor layers 37, and formed in lines extending in the row direction and repeatedly provided in the column direction. In addition, an insulation layer 45 is formed in the drain-side selection transistor layer 40, ranging from the top surface of the insulation layer 34 to a predetermined height above the drain-side isolation and insulation layer 44.

The drain-side first insulation layer 41 and the drain-side second insulation layer 43 are formed by silicon oxide ($SiO_2$). The drain-side conductive layer 42 is formed by $p^+$ type polysilicon (p-Si). The drain-side isolation and insulation layer 44 is formed by silicon nitride (SiN).

In addition, the drain-side selection transistor layer 40 has drain-side holes 46 formed therein so as to penetrate the drain-side isolation and insulation layer 44, the drain-side second insulation layer 43, the drain-side conductive layer 42, the drain-side first insulation layer 41, and the memory protection insulation layer 33. The drain-side holes 46 are provided at positions matching the memory holes 35. Drain-side gate insulation layers 47 and drain-side columnar semiconductor layers 48 are sequentially provided on the sidewalls facing the drain-side holes 46.

The drain-side gate insulation layers 47 are formed by silicon oxide ($SiO_2$). The drain-side columnar semiconductor layers 48 are formed by polysilicon (p-Si). In addition, the upper portions of the drain-side columnar semiconductor layers 48 are composed of $n^+$ type polysilicon.

Note that the configuration of the drain-side conductive layer 42 in the drain-side selection transistor layer 40 is restated as follows: the drain-side conductive layer 42 is formed to sandwich the drain-side gate insulation layers 47 with the drain-side columnar semiconductor layers 48.

In addition, in the drain-side selection transistor layer 40, the drain-side conductive layer 42 functions as a drain-side selection gate line SGD. In other words, the drain-side conductive layer 42 functions as the control gate of a drain-side selection transistor SDTrmn.

Further, plug holes 61a to 61h are formed in the source-side selection transistor layer 20, the memory transistor layer 30, and the drain-side selection transistor layer 40.

The plug hole 61a is formed to reach the $n^+$ area (source-line area) Ba2. The plug hole 61b is formed to reach the top surface of the source-side conductive layer 22. The plug holes 61c to 61f are formed to reach the top surfaces of the first to fourth word-line conductive layers 32a to 32d, respectively. The plug hole 61g is formed to reach the top surface of the drain-side conductive layer 42. The plug holes 61h are formed to reach the drain-side columnar semiconductor layers 48.

Barrier metal layers 62 and plug conductive layers 63 are sequentially formed on the respective sidewalls facing the plug holes 61a to 61h. The barrier metal layers 62 are composed of titanium/titanium nitride (Ti/TiN). The plug conductive layers 63 are composed of tungsten (W).

The wiring layer 50 has wiring first to fourth insulation layers 51 to 54 that are sequentially laminated on the top surface of the insulation layer 45. The wiring first insulation layer 51 and the wiring fourth insulation layer 54 are composed of silicon nitride (SiN). The wiring second insulation layer 52 and the wiring third insulation layer 53 are composed of silicon oxide ($SiO_2$).

In addition, the wiring layer 50 has wiring trenches 56a. The wiring trenches 56a are formed to penetrate the wiring first insulation layer 51 and the wiring second insulation layer 52. The wiring trenches 56a are provided at positions matching the plug holes 61a to 61h.

Barrier metal layers 56b and wiring conductive layers 56c are sequentially formed on the respective sidewalls facing the wiring trenches 56a. The barrier metal layers 56b are composed of titanium/titanium nitride (Ti/TiN). The wiring conductive layers 56c are composed of tungsten (W).

Next, the capacitor element area C is described. As illustrated in FIG. 8, in the capacitor element area C, the non-volatile semiconductor storage device 100 has, from lower layer to upper layer, a first insulation layer 81, a capacitor element layer 70, and second to sixth insulation layers 82 to 86 on the semiconductor substrate Ba. The capacitor element layer 70 includes the capacitor elements Cp1 to Cp3.

The first insulation layer 81 is composed of silicon oxide ($SiO_2$). The first insulation layer 81 is formed to the top surface of the source-side isolation and insulation layer 24 in the memory transistor area 12.

The capacitor element layer 70 has first to fifth capacitor element insulation layers (first interlayer insulation layers) 71a to 71e and first to fourth capacitor element conductive layers (first conductive layers) 72a to 72d that are alternately laminated on the first insulation layer 81.

The second capacitor element insulation layer 71b and the first capacitor element conductive layer 72a are formed in line with each other at their row-direction ends. The third capacitor element insulation layer 71c and the second capacitor element conductive layer 72b are formed in line with each other at their row-direction ends (the former has the end coincident with that of the latter). The fourth capacitor element insulation layer 71d and the third capacitor element conductive layer 72c are formed in line with each other at their row-direction ends. The fifth capacitor element insulation layer 71e and the fourth capacitor element conductive layer 72d are formed in line with each other at their row-direction ends. The second to fifth capacitor element insulation layers 71b to 71e and the first to fourth capacitor element conductive layers 72a to 72d are formed in a stepwise manner in relation to each other at their row-direction ends.

The first to fifth capacitor element insulation layers 71a to 71e are composed of silicon oxide ($SiO_2$). The first to fourth capacitor element conductive layers 72a to 72d are composed of polysilicon (p-Si).

The first to fifth capacitor element insulation layers 71a to 71e are formed in the same layer as the first to fifth inter-wordline insulation layers 31a to 31e. The first to fourth capacitor element conductive layers 72a to 72d are formed in the same layer as the first to fourth word-line conductive layers 32a to 32d.

Furthermore, the material of the first to fifth capacitor element insulation layers 71e to 71e is the same as that of the first to fifth inter-wordline insulation layers 31a to 31e. the material of the first to fourth capacitor element conductive layers 72a to 72d is the same as that of the first to fourth word-line conductive layers 32a to 32d. This means that the memory transistor area 12 and the capacitor element area C may be formed at the same time.

The second insulation layer 82 is formed to the top surface of the insulation layer 45, covering the capacitor element layer 70. The third insulation layer 83 is formed on the second insulation layer 82 to the top surface of the wiring first insulation layer 51. The fourth insulation layer 84 is formed on the third insulation layer 83 to the top surface of the wiring second insulation layer 52. The fifth insulation layer 85 is formed on the fourth insulation layer 84 to the top surface of the wiring third insulation layer 53. The sixth insulation layer 86 is formed on the fifth insulation layer 85 to the top surface of the wiring fourth insulation layer 54.

The second, fourth, and fifth insulation layers 82, 84, and 85 are composed of silicon oxide ($SiO_2$). The third and sixth insulation layers 83 and 86 are composed of silicon nitride (SiN).

Contact holes 91a to 91d are formed in the capacitor element layer 70 and the second insulation layer 82. The contact hole 91a is formed to reach the second capacitor element conductive layer 72b. The contact hole 91b is formed to reach the fourth capacitor element conductive layer 72d. The contact hole 91c is formed to reach the first capacitor element conductive layer 72a. The contact hole 91d is formed to reach the third capacitor element conductive layer 72c.

The contact holes 91a to 91d have contact conductive layers 92 formed therein. The contact conductive layers 92 are composed of titanium/titanium nitride (Ti/TiN) and tungsten (W).

First and second wiring trenches 94a and 94b are formed in the second and third insulation layers 82 and 83. The first wiring trench 94a is formed above the contact holes 91a and 91b. The second wiring trench 94b is formed above the contact holes 91c and 91d.

The first and second wiring trenches 94a and 94b have first and second wiring conductive layers 95a and 95b formed therein. The first and second wiring conductive layers 95a and 95b are composed of titanium/titanium nitride (Ti/TiN) and tungsten (W).

The first wiring conductive layer 95a is connected to a predetermined potential. The second wiring conductive layer 95b is connected to the ground potential. In this case, for example, the predetermined potential is 2.5V. Thus, the first capacitor element conductive layer 72a and the third capacitor element conductive layer 72c are connected to the ground potential, while the second capacitor element conductive layer 72b and the fourth capacitor element conductive layer 72d connected to the predetermined potential.

With this configuration, a capacitor element is provided that has the first capacitor element conductive layer 72a and the second capacitor element insulation layer 71b as upper and lower electrodes, and the second capacitor element conductive layer 72b as a dielectric film. Another capacitor element is also provided that has the second capacitor element conductive layer 72b and the third capacitor element insulation layer 71c as upper and lower electrodes, and the fourth capacitor element conductive layer 72c as a dielectric film. Still another capacitor element is also provided that has the third capacitor element conductive layer 72c and the fourth capacitor element insulation layer 71d as upper and lower electrodes, the fourth capacitor element conductive layer 72d as a dielectric film.

This means that the first to fourth capacitor element conductive layers 72a to 72d function as the capacitance lines CpL1 to CpL4. The first to fifth capacitor element insulation layers 71a to 71e function as interlayer insulation layers between the capacitance lines CpL1 to CpL4. The contact conductive layers 92 in the contact holes 91a and 91b function as the first contact lines CL1. The contact conductive layers 92 in the contact holes 91c and 91d function as the second contact lines CL2. The first wiring conductive layer 95a functions as the first wiring L1. The second wiring conductive layer 95b functions as the second wiring L2.

(Advantages of Non-Volatile Semiconductor Storage Device 100 in First Embodiment)

Advantages of the non-volatile semiconductor storage device 100 according to the first embodiment will now be described below. As can be seen from the above lamination structure, the non-volatile semiconductor storage device 100 according to the first embodiment may achieve high integration. In addition, as described in the above manufacturing process of the non-volatile semiconductor storage device 100, each layer corresponding to respective memory transistors MTrmn, source-side selection transistors SSTrmn, and drain-side selection transistors SDTrmn may be manufactured in a predetermined number of lithography steps, irrespective of the number of laminated layers. That is, the non-volatile semiconductor storage device 100 may be manufactured at a lower cost.

In addition, the non-volatile semiconductor storage device 100 according to the first embodiment of the present invention has the capacitor element area C. The capacitor element area C includes the capacitor elements Cp1 to Cp3 with lamination structure in the laminated first to fifth capacitor element insulation layers 71a to 71e (the word lines WL1 to WL4) and first to fourth capacitor element conductive layers 72a to 72d. Accordingly, the non-volatile semiconductor storage device 100 according to the first embodiment may reduce the areas occupied by the capacitor elements Cp1 to Cp3.

In addition, the first to fifth capacitor element insulation layers 71a to 71e are formed in the same layer as the first to fifth inter-wordline insulation layers 31a to 31e. In addition, the first to fourth capacitor element conductive layers 72a to 72d are formed in the same layer as the first to fourth word-line conductive layers 32a to 32d. A material of the first to fifth capacitor element insulation layers 71a to 71e may be the same as that of the first to fifth inter-wordline insulation layers 31a to 31e, both being formed in the same layer in the same step. A material of the first to fourth capacitor element conductive layers 72a to 72d may be the same as that of the first to fourth word-line conductive layers 32a to 32d, both being formed in the same layer in the same step. Accordingly, the capacitor elements Cp1 to Cp4 may be created in substantially the same step as the memory transistors MTrmn, etc., being formed. This means that the non-volatile semiconductor storage device 100 according to the first embodiment may provide improvements in the production yields.

Second Embodiment (Specific Configuration of Non-Volatile Semiconductor Storage Device in Second Embodiment)

Figure 9:
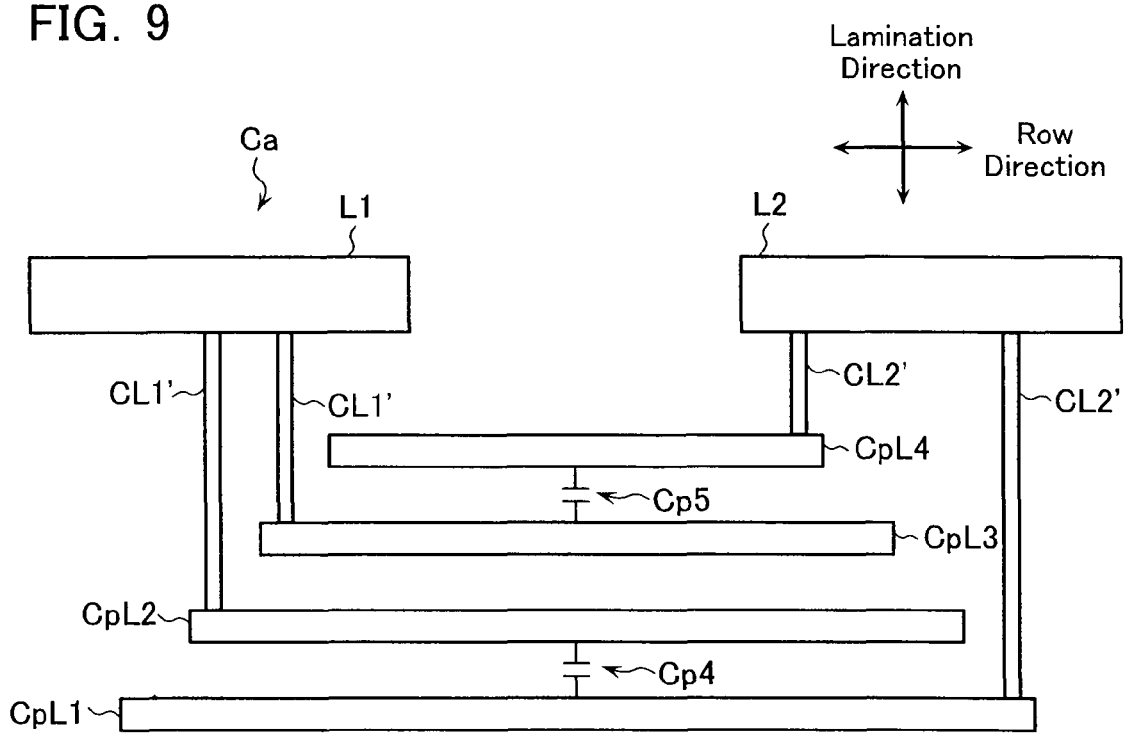
FIG. 9 is a schematic cross-sectional view illustrating a part of a capacitor element area Ca in a non-volatile semiconductor storage device according to a second embodiment.
Figure 10:
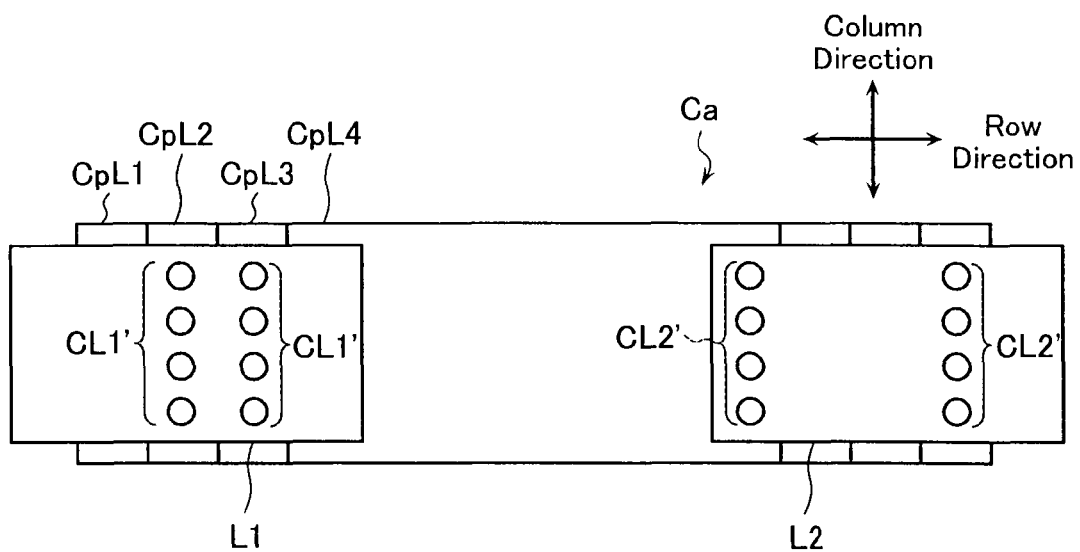
FIG. 10 is a schematic top plan view illustrating a part of the capacitor element area Ca in the non-volatile semiconductor storage device according to the second embodiment.

Referring now to FIGS. 9 and 10, a configuration of a non-volatile semiconductor storage device according to a second embodiment of the present invention will be described below. FIG. 9 is a schematic cross-sectional view illustrating a part of a capacitor element area Ca in the non-volatile semiconductor storage device according to the second embodiment; and FIG. 10 is a top plan view thereof. Note that the same reference numerals represent the same components as the first embodiment and description thereof will be omitted in the second embodiment.

As illustrated in FIGS. 9 and 10, the non-volatile semiconductor storage device according to the second embodiment has a capacitor element area Ca different from the first embodiment. The second embodiment is different from the first embodiment in the configurations of first contact lines CL1' and second contact lines CL2' in the capacitor element area Ca.

The first contact lines CL1' are connected to the second lowest capacitance line CpL2. In addition, the first contact lines CL1' are connected to the third lowest capacitance line CpL3. These first contact lines CL1' are connected to the first wiring L1. Thus, the capacitance lines CpL2 and CpL3 are connected to a predetermined potential via the first contact lines CL1'.

The second contact lines CL2' are connected to the lowest capacitance line CpL1. In addition, the second contact lines CL2' are connected to the fourth lowest capacitance line CpL4. These second contact lines CL2' are connected to the second wiring L2. Thus, the capacitance line CpL1 and the capacitance line CpL4 are connected to the ground potential via the second contact lines CL2'.

With this configuration, a capacitor element Cp4 is provided that has the capacitance lines CpL1 and CpL2 as upper and lower electrodes, and an interlayer insulation layer between the capacitance lines CpL1 and CpL2 as a dielectric film. A capacitor element Cp5 is also provided that has the capacitance lines CpL3 and CpL4 as upper and lower electrodes, and an interlayer insulation layer between the capacitance line CpL3 and the capacitance line CpL4 as a dielectric film.

That is, in this case, four layers of capacitance lines CpL are provided, the second contact lines CL2' are connected to the bottommost capacitance line CpL1 and the topmost capacitance line CpL4, and the first contact lines CL1' are connected to the middle two capacitance lines CpL2 and CpL3. If there are M layers of capacitance lines CpL (where M is a natural number not less than 4), then the 3n+1th capacitance line CpL from the bottommost one (where n is a natural number not less than 0) may be connected to a second contact line CL2', while the 3n+2th and 3n+3th capacitance lines CpL from the bottommost one may be connected to first contact lines CL1'.

(Advantages of Non-Volatile Semiconductor Storage Device in Second Embodiment)

Advantages of the non-volatile semiconductor storage device according to the second embodiment are described. As can be seen from the configuration described above, it has the same advantages as described in the first embodiment.

Third Embodiment (Configuration of Non-Volatile Semiconductor Storage Device in Third Embodiment)

Figure 11:
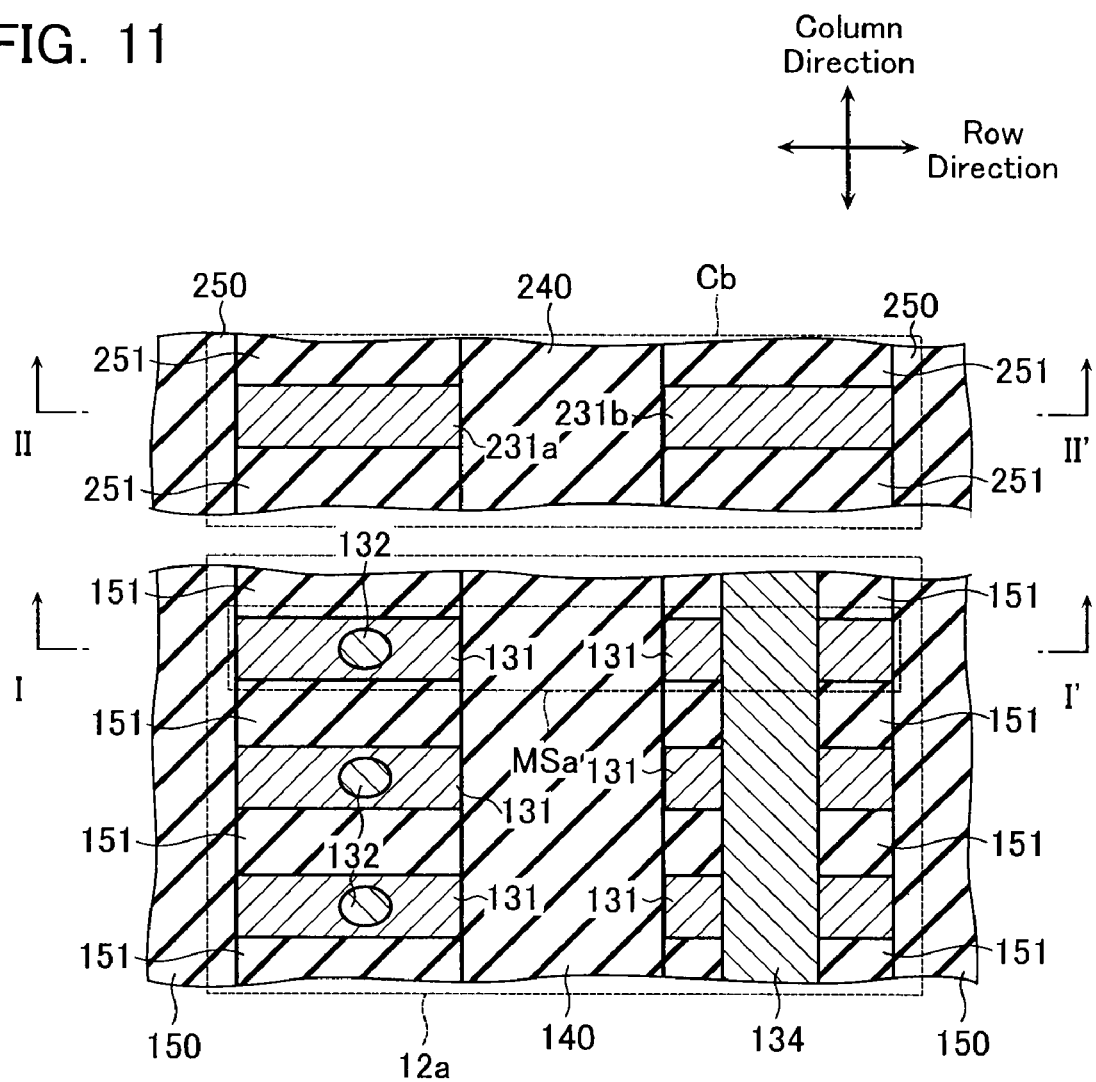
FIG. 11 is a top plan view of a non-volatile semiconductor storage device according to a third embodiment.
Figure 12:
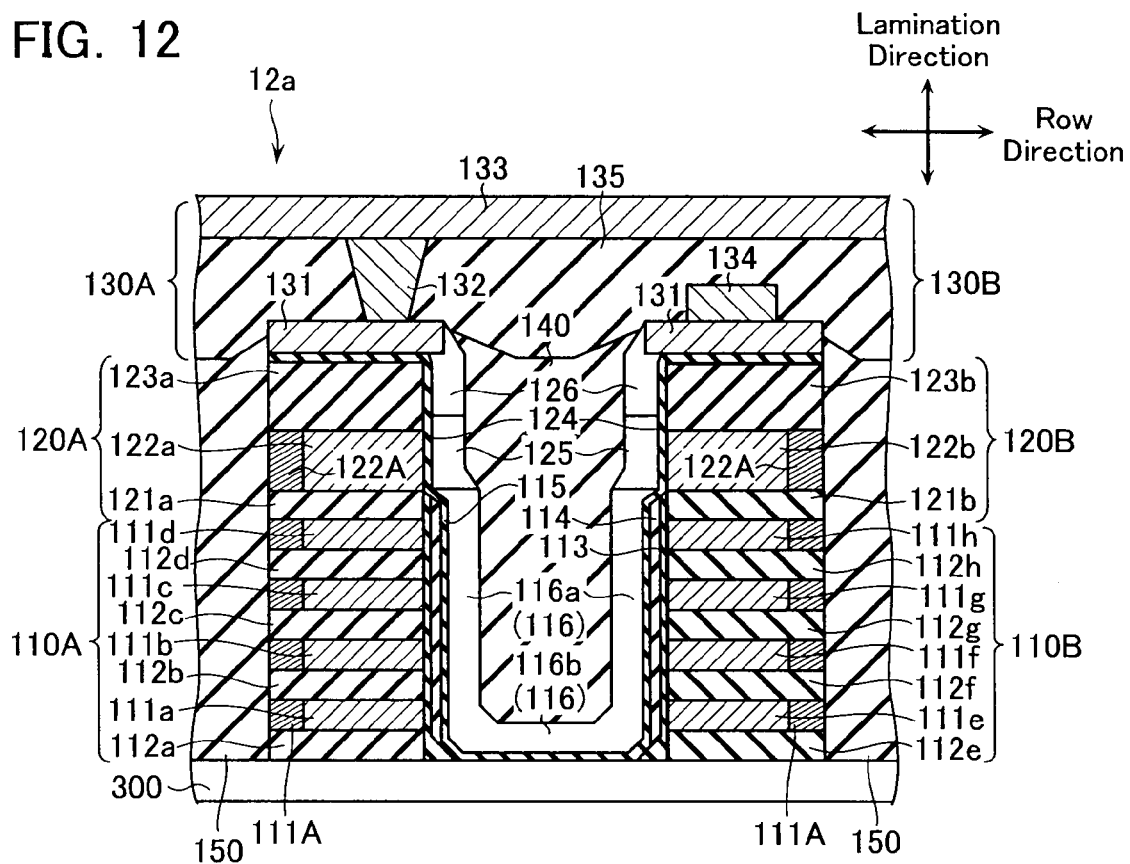
FIG. 12 is a cross-sectional view specifically illustrating the memory transistor area 12a in the non-volatile semiconductor storage device according to the third embodiment.
Figure 13A:
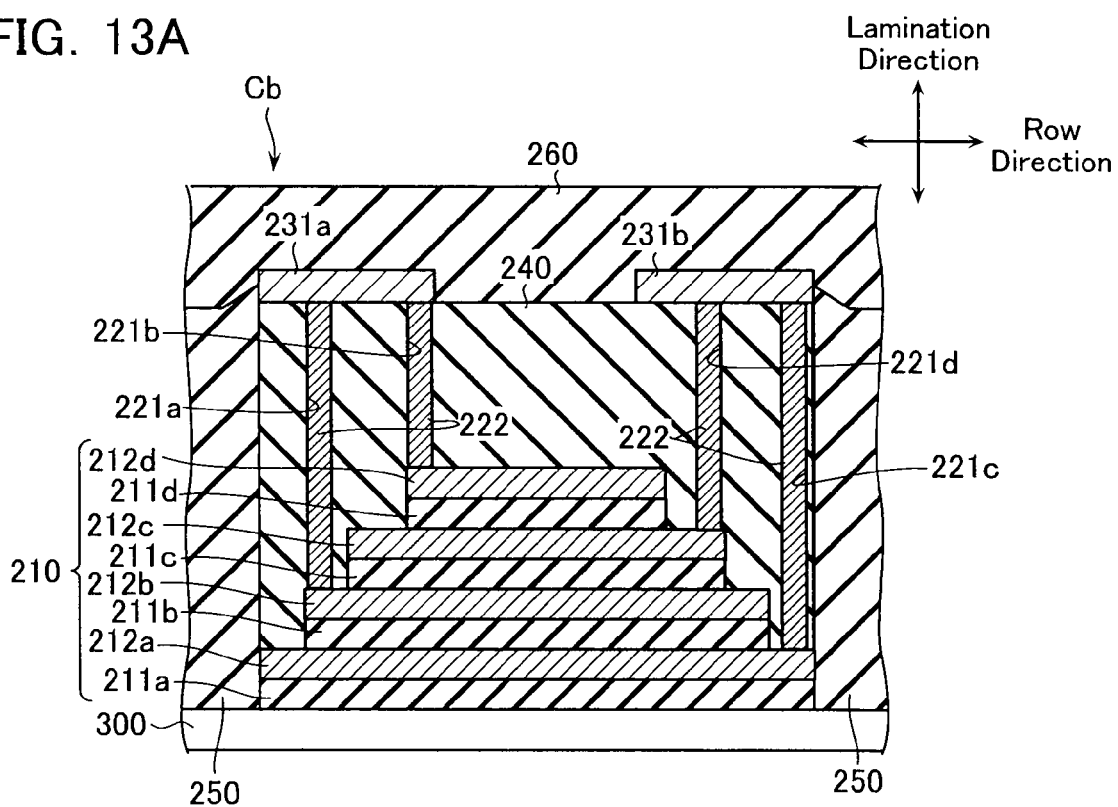
FIG. 13A is a cross-sectional view specifically illustrating a capacitor element area Cb in the non-volatile semiconductor storage device according to the third embodiment.

Referring now to FIGS. 11 to 13A, a configuration of a non-volatile semiconductor storage device according to a third embodiment of the present invention will be described below. FIG. 11 is a schematic top plan view of the non-volatile semiconductor storage device according to the third embodiment. FIG. 12 is a cross-sectional view taken along the line I-I' of FIG. 11; and FIG. 13A is a cross-sectional view taken along the line II-II' of FIG. 11. Note that the same reference numerals represent the same components as the first and second embodiments and description thereof will be omitted in the third embodiment.

As illustrated in FIG. 11, the non-volatile semiconductor storage device according to the third embodiment comprises a memory transistor area 12a having a plurality of memory strings MSa, and a capacitor element area Cb having capacitor elements. In the memory transistor area 12a, the memory strings MSa are repeatedly provided to sandwich respective insulation layers, each spaced apart by a predetermined pitch in the column direction. In addition, the capacitor element area Cb is provided in such a way that both column- and row-direction ends thereof are sandwiched by insulation layers.

As illustrated in FIG. 12, in the memory transistor area 12a, a pair of first lamination parts 110A and 110B are formed on the semiconductor substrate 300. A second lamination part 120A and a third lamination part 130A are laminated on the first lamination part 110A. Similarly, a second lamination part 120B and a third lamination part 130B are laminated on the first lamination part 110B. Note that the first lamination part 110A (the second lamination part 120A and the third lamination part 130A) and the first lamination part 110B (the second lamination part 120B and the third lamination part 130B) are formed apart from each other by a predetermined distance in the row direction. Insulation layers 140 and 150 are deposited around the circumferences of the first lamination part 110A (the second lamination part 120A and the third lamination part 130A) and the first lamination part 110B (the second lamination part 120B and the third lamination part 130B).

The first lamination part 110A is formed with alternately laminated first to fourth word-line conductive layers 111a to 111d (first conductive layers) and first to fourth inter-wordline insulation layers 112a to 112d (first interlayer insulation layers) (from the bottommost one).

The first lamination part 110B is formed with alternately laminated fifth to eighth word-line conductive layers (first conductive layers) 111e to 111h and fifth to eighth inter-wordline insulation layers (first interlayer insulation layers) 112e to 112h (from the bottommost one).

The first to eighth word-line conductive layers 111a to 111h function as the above-mentioned word lines WL. In addition, the first to eighth word-line conductive layers 111a to 111h function as the control gates of the above-mentioned memory transistors MTrmn.

The first to eighth word-line conductive layers 111a to 111h are composed of polysilicon (p-Si). The first to fourth word-line conductive layers 111a to 111d and the fifth to eighth word-line conductive layers 111e to 111h have silicide layers 111A at their respective ends opposed to the side where the first lamination parts 110A and 110B face each other in the row direction.

The first to eighth inter-wordline insulation layers 112a to 112h are composed of silicon oxide ($SiO_2$).

In addition, each of the first lamination parts 110A and 110B has a block insulation layer 113, a charge accumulation layer 114, a tunnel insulation layer 115, and an $n^-$ type semiconductor layer 116 on a respective side surface where the first lamination parts 110A and 110B face each other through the insulation layer 140.

The block insulation layers 113 are formed in contact with the respective sidewalls of the first to eighth word-line conductive layers 111a to 111h and the first to eighth inter-wordline insulation layers 112a to 112h. The block insulation layers 113 are composed of silicon oxide ($SiO_2$). The charge accumulation layers 114 are provided in contact with the block insulation layers 113 and to accumulate charges. The charge accumulation layers 114 are composed of silicon nitride (SiN). The tunnel insulation layers 115 are provided in contact with the charge accumulation layers 114. The tunnel insulation layers 115 are composed of silicon oxide ($SiO_2$).

The $n-$ type semiconductor layer 116 has a U-shaped cross-section in the direction of I-I'. The n type semiconductor layer 116 has side parts 116a, 116a that are provided in contact with respective tunnel insulation layers 115 and formed to extend in the lamination direction (in a pillar-like fashion), and a bottom part 116b that is formed to connect the bottom portions of the pair of side parts 116a, 116a. Note that the $n^-$ type semiconductor layer 116 includes a semiconductor layer to which a low-concentration $n^-$ type impurity is introduced.

The second lamination part 120A has a drain-side first insulation layer 121a, a drain-side conductive layer 122a, and a drain-side second insulation layer 123a that are sequentially laminated on the first lamination part 111A (the fourth word-line conductive layer 111d). The drain-side conductive layer 122a functions as the above-mentioned drain-side selection gate line SGD. The drain-side conductive layer 122a also functions as the control gate of the drain-side selection transistor SDT.

The drain-side first insulation layer 121a and the drain-side second insulation layer 123a are composed of silicon oxide ($SiO_2$). The drain-side conductive layer 122a is composed of polysilicon (p-Si). The drain-side conductive layer 122a has a silicide layer 122A at an end opposed to the side where the second lamination parts 120A and 120B face each other in the row direction.

The second lamination part 120B has a source-side first insulation layer 121b, a source-side conductive layer 122b, and a source-side second insulation layer 123b that are sequentially laminated on the first lamination part 110B (the eighth word-line conductive layer 111h). The source-side conductive layer 122b functions as the above-mentioned source-side selection gate line SGS. The source-side conductive layer 122b also functions as the control gate of the source-side selection transistor SST.

The source-side first insulation layer 121b and the source-side second insulation layer 123b are composed of silicon oxide ($SiO_2$). The source-side conductive layer 122b is composed of polysilicon (p-Si). The source-side conductive layer 122b has a silicide layer 122A at an end opposed to the side where the second lamination parts 120A and 120B face each other in the row direction.

In addition, each of the second lamination parts 120A and 120B has a gate insulation layer 124, a $p^-$ type semiconductor layer 125, and an $n^+$ type semiconductor layer 126 on a respective side surface where the drain-side conductive layer 122a and the source-side conductive layer 122b face each other through the insulation layer 140.

The gate insulation layers 124 are provided in contact with the respective sidewalls of the drain-side conductive layer 122a, the drain-side second insulation layer 123a, the source-side conductive layer 122b, and the source-side second insulation layer 123b. The $p^-$ type semiconductor layers 125 are provided in the same layer as the drain-side conductive layer 122a and the source-side conductive layer 122b in the lamination direction. The $p^-$ type semiconductor layers 125 are formed in contact with the side surfaces of the gate insulation layers 124 and the top surface of the $n^-$ type semiconductor layer 116. The $p^-$ type semiconductor layers 125 are semiconductor layers to which low-concentration p type impurities are introduced. The $n^+$ type semiconductor layers 126 are provided in contact with the side surfaces of the gate insulation layers 124 and the top surfaces of the $p^-$ type semiconductor layers 125.

The third lamination parts 130A and 130B have contact layers 131 that are formed above the drain-side second insulation layer 123a and the source-side second insulation layer 123b, respectively.

One end of each contact layer 131 is formed in contact with the upper portion of the respective $n^+$ type semiconductor layer 126. Each contact layer 131 is formed in rectangular plate shape with the row direction taken as the longitudinal direction. Note that each contact layer 131 includes a silicide layer.

Further, the third lamination part 130A has contact plug layers 132 that are provided on the top surfaces of the contact layers 131 and a wiring layer 133 that is provided on the top surfaces of the contact plug layers 132.

The wiring layer 133 is formed across, and in contact with, the top surfaces of the contact plug layers 132 in multiple second lamination parts 120A. The wiring layer 133 functions as the above-mentioned bit line BL.

In addition, the third lamination part 130B has a wiring layer 134 that is provided on the top surfaces of the contact layers 131. The wiring layer 134 is formed on the top surfaces of the contact layers 131. The wiring layer 134 is formed across, and in contact with, the top surfaces of the contact layers 131 in multiple second lamination parts 120B aligned in the column direction. The wiring layer 134 functions as the above-mentioned source line SL. Note that an insulation layer 135 is formed between the bottom surface of the wiring layer 133 and the insulation layers 140, 150.

As illustrated in FIG. 13A, in the capacitor element area Cb, a capacitor element layer 210, a first insulation layer 240, first and second wiring conductive layers 231a and 231b, and a second insulation layer 260 are sequentially formed on the semiconductor substrate 300. Insulation layers 250 are deposited around the circumferences of the capacitor element layer 210, the first insulation layer 240, the first and second wiring conductive layers 231a and 231b, and the second insulation layer 260.

The capacitor element layer 210 has first to fourth capacitor element insulation layers (second interlayer insulation layers) 211a to 211d and first to fourth capacitor element conductive layers (second conductive layers) 212a to 212d that are alternately laminated on the semiconductor substrate 300. The first capacitor element insulation layer 211a and the first capacitor element conductive layer 212a are formed in line with each other at their row-direction ends. The second capacitor element insulation layer 211b and the second capacitor element conductive layer 212b are formed in line with each other at their row-direction ends. The third capacitor element insulation layer 211c and the third capacitor element conductive layer 212c are formed in line with each other at their row-direction ends. The fourth capacitor element insulation layer 211d and the fourth capacitor element conductive layer 212d are formed in line with each other at their row-direction ends. In addition, the first to fourth capacitor element insulation layers 211a to 211d and the first to fourth capacitor element conductive layers 212a to 212d are formed in a stepwise manner in relation to each other at their row-direction ends.

The first capacitor element insulation layer 211a is formed in the same layer as the first and fifth inter-wordline insulation layers 112a and 112e. The second capacitor element insulation layer 211b is formed in the same layer as the second and sixth inter-wordline insulation layers 112b and 112f. The third capacitor element insulation layer 211c is formed in the same layer as the third and seventh inter-wordline insulation layers 112c and 112g. The fourth capacitor element insulation layer 211d is formed in the same layer as the fourth and eighth inter-wordline insulation layers 112d and 112h.

The first capacitor element conductive layer 212a is formed in the same layer as the first and fifth word-line conductive layers 111a and 111e. The second capacitor element conductive layer 212b is formed in the same layer as the second and sixth word-line conductive layers 111b and 111f. The third capacitor element conductive layer 212c is formed in the same layer as the third and seventh word-line conductive layers 111c and 111g. The fourth capacitor element conductive layer 212d is formed in the same layer as the fourth and eighth word-line conductive layers 111d and 111h.

The first to fourth capacitor element insulation layers 211a to 211d are composed of silicon oxide ($SiO_2$). The first to fourth capacitor element conductive layers 212a to 212d are composed of polysilicon (p-Si).

Furthermore, the material of the first capacitor element insulation layers 211a is the same as that of the first and fifth inter-wordline insulation layers 112a and 112e. The material of the second capacitor element insulation layer 211b is the same as that of the second and sixth inter-wordline insulation layers 112b and 112g. The material of the third capacitor element insulation layer 211c is the same as that of the third and seventh inter-wordline insulation layers 112c and 112g. The material of the fourth capacitor element insulation layer 211d is the same as that of the fourth and eighth inter-wordline insulation layers 112d and 112h. This means that the first lamination part 110A, 110B and the capacitor element area C may be formed at the same time.

The first insulation layer 240 is formed to cover the first to fourth capacitor element insulation layers 211a to 211d and the first to fourth capacitor element conductive layers 212a to 212d. The first insulation layer 240 is formed as high as the top portion of the insulation layer 140.

The first and second wiring conductive layers 231a and 231b are formed in the same layer as the contact layers 131. The second insulation layer 260 is formed as high as the top surface of the insulation layer 135. The first and second wiring conductive layers 231a and 231b are composed of titanium/titanium nitride (Ti/TiN) and tungsten (W).

Contact holes 221a to 221d are formed in the capacitor element layer 210 and the first insulation layer 240. The contact hole 221a is formed to reach the second capacitor element conductive layer 212b. The contact hole 221b is formed to reach the fourth capacitor element conductive layer 212d. The contact hole 221c is formed to reach the first capacitor element conductive layer 212a. The contact hole 221d is formed to reach the third capacitor element conductive layer 212c.

The contact holes 221a to 221d have contact conductive layers 222 formed therein. The contact conductive layers 222 are composed of titanium/titanium nitride (Ti/TiN) and tungsten (W).

The first wiring conductive layer 231a is provided on the contact holes 221a and 221b. The second wiring conductive layer 231b is provided on the contact holes 221c and 221d.

The first wiring conductive layer 231a is connected to a predetermined potential. The second wiring conductive layer 231b is connected to the ground potential. Thus, the first capacitor element conductive layer 212a and the third capacitor element conductive layer 212c are connected to the ground potential, while the second capacitor element conductive layer 212b and the fourth capacitor element conductive layer 212d connected to the predetermined potential.

With this configuration, a capacitor element is provided that has the first capacitor element conductive layer 212a and the second capacitor element conductive layer 212b as upper and lower electrodes, and the second capacitor element insulation layer 211b as a dielectric film. Another capacitor element is also provided that has the second capacitor element conductive layer 212b and the third capacitor element conductive layer 212c as upper and lower electrodes, and the third capacitor element insulation layer 211c as a dielectric film. Still another capacitor element is also provided that has the third capacitor element conductive layer 212c and the fourth capacitor element conductive layer 212d as upper and lower electrodes, and the fourth capacitor element insulation layer 211d as a dielectric film.

This means that the first to fourth capacitor element conductive layers 212a to 212d function as the above-mentioned capacitance lines CpL1 to CpL4. The first to fourth capacitor element insulation layers 211a to 211d function as the inter-layer insulation layers between the capacitance lines CpL1 to CpL4. The contact conductive layers 222 in the contact holes 221a and 221b function as the above-mentioned first contact lines CL1. The contact conductive layers 222 in the contact holes 221c and 221d function as the above-mentioned second contact lines CL2. The first wiring conductive layer 231a functions as the above-mentioned first wiring L1. The second wiring conductive layer 231b functions as the above-mentioned second wiring L2.

(Advantages of Non-Volatile Semiconductor Storage Device in Third Embodiment)

Advantages of the non-volatile semiconductor storage device according to the third embodiment of the present invention are described. It has the same advantages as described in the first and second embodiments.

Variations of First to Third Embodiments

While the first to third embodiments of the non-volatile semiconductor storage device have been described, the present invention is not intended to be limited to the disclosed embodiments and various other changes, additions, replacements or the like may be made thereto without departing from the spirit of the invention. For example, in the non-volatile semiconductor storage device according to the third embodiment, the first to fourth capacitor element conductive layers 212a to 212d and the first and second wiring conductive layers 231a and 231b may be connected as described in the configuration of the second embodiment.

In addition, the number of laminated layers for the word lines WL (word-line conductive layers) and the capacitance lines CpL (capacitor element conductive layers) is not limited to that described in the above-mentioned embodiments, but larger numbers of laminated layers may be provided therein.

In addition, the first embodiment has such a configuration where the n+1th word line from the bottommost one among WL1 to WL4 (the first to fourth word-line conductive layers 32a to 32d) (where n is a natural number not less than 0) is connected to the ground potential, while the n+2th word line from the bottommost one among WL1 to WL4 connected to the predetermined potential. The present invention, however, is not intended to be limited to this configuration, and it may employ another configuration where the n+1th word line from the bottommost one among WL1 to WL4 is connected to the predetermined potential, while the n+2th word line from the bottommost one among WL1 to WL4 connected to the ground potential.

In addition, the second embodiment has such a configuration where the 3n+1th word line from the bottommost one among WL1 to WL4 (where n is a natural number not less than 0) is connected to the ground potential, while the 3n+2th and 3n+3th word lines from the bottommost one among WL1 to WL4 connected to the predetermined potential. The present invention, however, is not intended to be limited to this configuration, and it may employ another configuration where the 3n+1th word line from the bottommost one among WL1 to WL4 is connected to the predetermined potential, while the 3n+2th and 3n+3th word lines from the bottommost one among WL1 to WL4 connected to the ground potential.

Figure 13B:
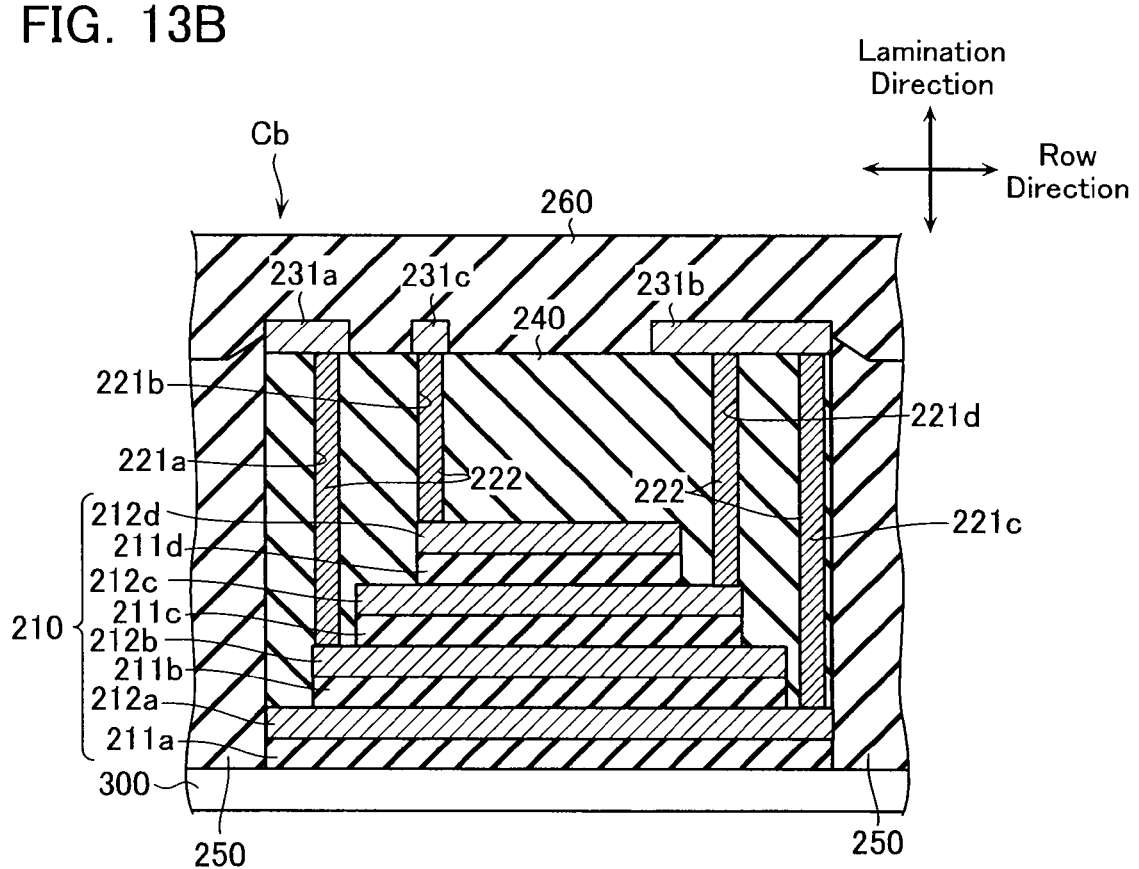
FIG. 13B is a cross-sectional view specifically illustrating a capacitor element area Cb in the non-volatile semiconductor storage device according to the modified version of the third embodiment.

Furthermore, as shown FIG. 13B the fourth capacitor element conductive layer 212d may be connected via the contact conductive layer 222 to a third wiring conductive layer 231c that is independent from the first wiring conductive layer 231a, and the third wiring conductive layer 212d may be in a floating state. In this case, the capacitor element formed between the fourth capacitor element conductive layer 212d and the third capacitor element conductive layer 121c does not work.

Similarly, although not shown in the figures, the first capacitor element 212a may be connected via the contact conductive layer 222 to a wiring conductive layer that is independent from the second wiring conductive layer 231b, and the wiring conductive layer may be in a floating state.

In this way, independently controlling voltages provided to each of the capacitor element conductive layers 212a to 212d may adjust the capacitive value of the capacitor element. Note that the first wiring conductive layer 231a, the second wiring conductive layer 231b and the third wiring conductive layer 231c may be formed in the same layer at the same time.

Fourth Embodiment

Figure 14:
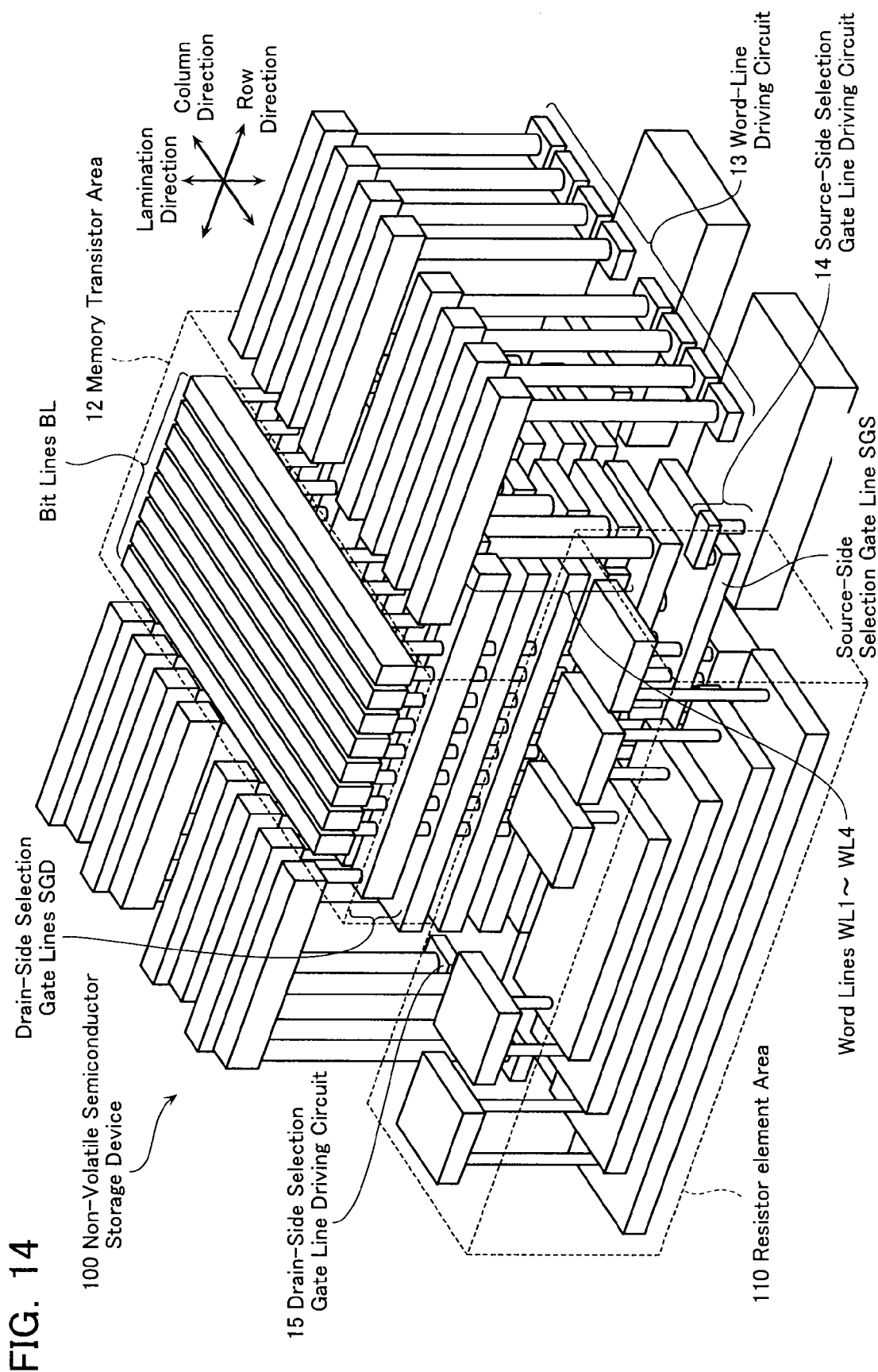
FIG. 14 illustrates a configuration of a semiconductor storage device 100 according to a fourth embodiment of the present invention.

FIG. 14 is a schematic diagram illustrating a semiconductor storage device 100 according to a fourth embodiment of the present invention. Note that the same reference numerals represent the same components as the first to third embodiments and detailed description thereof will be omitted in the fourth embodiment. As illustrated in FIG. 14, similar to the first embodiment (FIG. 1), the non-volatile semiconductor storage device 100 of this embodiment comprises: a memory transistor area 12; a word-line driving circuit 13; a source-side selection gate line (SGS) driving circuit 14; a drain-side selection gate line (SGD) driving circuit 15; a sense amplifier (not illustrated); and so on. This embodiment has a resistor element area 110 in addition to or in place of the capacitor element area C. In addition, the memory transistor area 12 and the memory strings MS may be configured in a similar way to that illustrated in FIGS. 2, 6, and 7.

Figure 15:
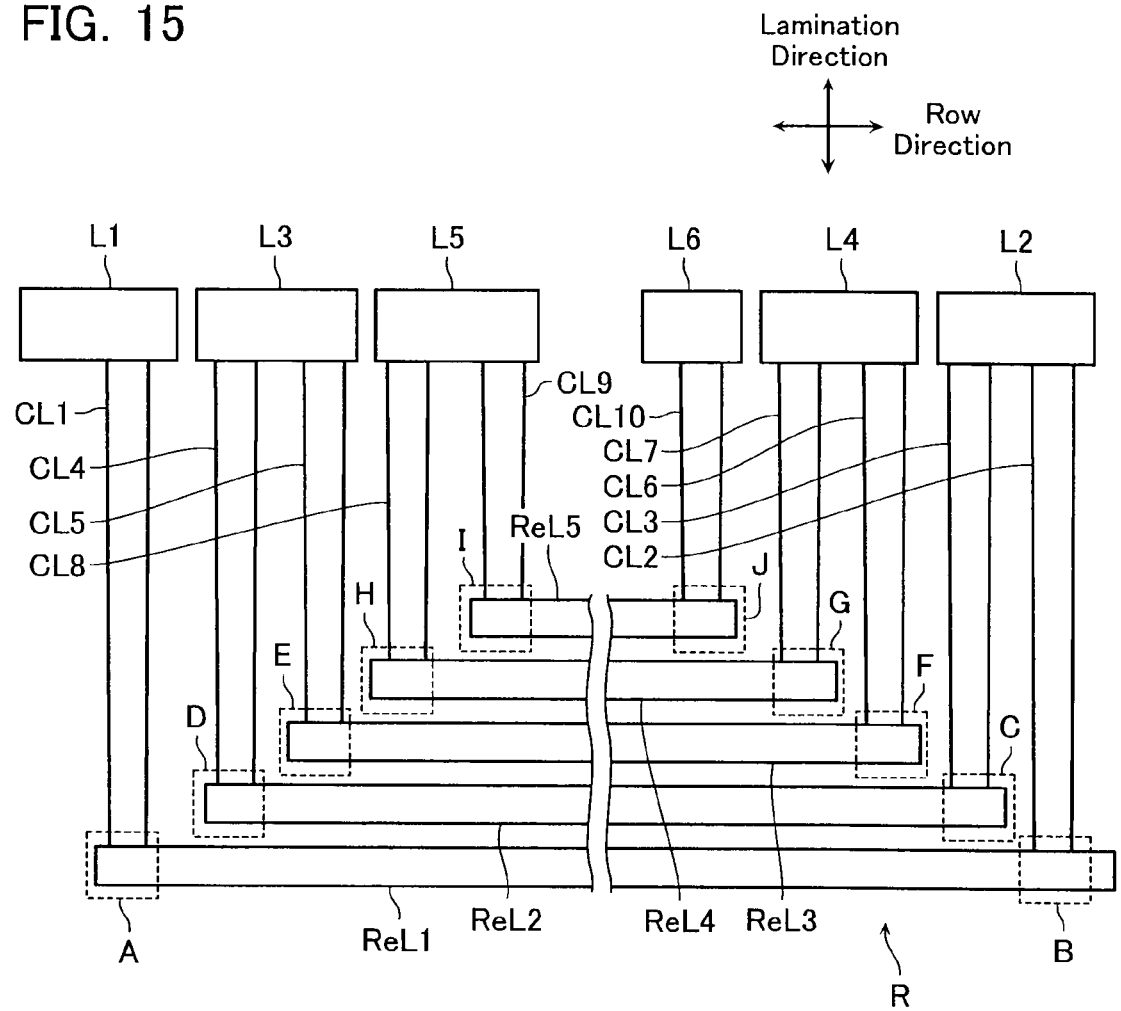
FIG. 15 is a partial cross-sectional view of the resistor element area 110 in the semiconductor storage device 100 according to the fourth embodiment.
Figure 16:
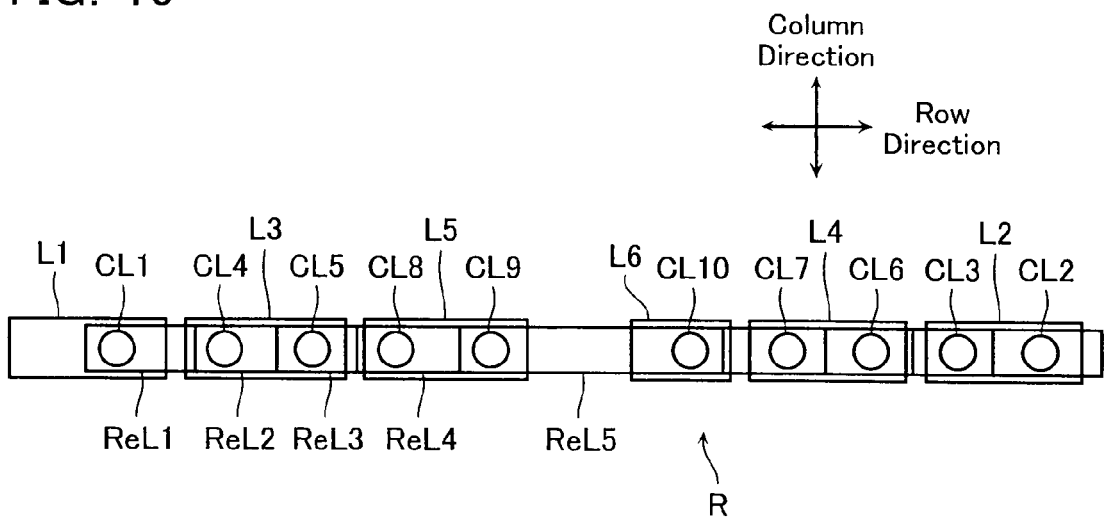
FIG. 16 is a partial top plan view of the resistor element area 110 in the semiconductor storage device 100 according to the fourth embodiment.

Referring now to FIGS. 15 and 16, a configuration of the resistor element area 110 will be described below.

FIG. 15 is a partial cross-sectional view of the resistor element area 110; and FIG. 16 is a top plan view thereof. The resistor element area 110 has resistance lines (second conductive layers) ReL1 to ReL5 expanding in the row and column directions, a plurality of contact lines (contact layers) CL1 to CL10 connected to the resistance lines ReL1 to ReL5 and extending upward therefrom, and wirings (upper wiring layers) L1 to L6 connected to the upper ends of the contact layers CL1 to CL10.

The resistance lines ReL1 to ReL5 are laminated on the semiconductor substrate Ba, and the ends of the resistance lines ReL1 to ReL5 are formed in a stepwise manner in relation to each other. In addition, the laminated multiple resistance lines ReL are formed in the same layer as the respective word lines WL.

The first contact line CL1 is connected to the row-direction end A of the lowest resistance line ReL1. In addition, the second contact line CL2 is connected to the row-direction end B of the resistance line ReL1 that is different from the end A to which the first contact line CL1 is connected.

The third contact line CL3 is connected to the row-direction end C of the second lowest resistance line ReL2. In addition, the fourth contact line CL4 is connected to the row-direction end D of the resistance line ReL2 that is different from the end C to which the third contact line CL3 is connected.

The fifth contact line CL5 is connected to the row-direction end E of the third lowest resistance line ReL3. In addition, the sixth contact line CL6 is connected to the row-direction end F of the resistance line ReL3 that is different from the end E to which the fifth contact line CL5 is connected.

The seventh contact line CL7 is connected to the row-direction end G of the fourth lowest resistance line ReL4. In addition, the eighth contact line CL8 is connected to the row-direction end H of the resistance line ReL4 that is different from the end G to which the seventh contact line CL7 is connected.

The ninth contact line CL9 is connected to the row-direction end I of the fifth lowest resistance line ReL5. In addition, the tenth contact line CL10 is connected to the row-direction end J of the resistance line ReL5 that is different from the end I to which the ninth contact line CL9 is connected.

It should be noted that while five layers of resistance lines ReL are formed in FIG. 15, this embodiment is not intended to be limited to the five laminated layers as illustrated in FIG. 15.

The first wiring L1 is connected to the upper end of the first contact line CL1 and to a peripheral circuit formed in an external device or the semiconductor storage device 100.

The second wiring L2 is connected to the respective upper ends of the second contact line CL2 and the third contact line CL3. Consequently, the second wiring L2 connects the resistance line ReL1 to the resistance line ReL2 through the second contact line CL2 and the third contact line CL3, respectively.

The third wiring L3 is connected to the respective upper ends of the fourth contact line CL4 and the fifth contact line CL5. Consequently, the third wiring L3 connects the resistance line ReL2 to the resistance line ReL3 through the fourth contact line CL4 and the fifth contact line CL5, respectively.

The fourth wiring L4 is connected to the respective upper ends of the sixth contact line CL6 and the seventh contact line CL7. Consequently, the fourth wiring L4 connects the resistance line ReL3 to the resistance line ReL4 through the sixth contact line CL6 and the seventh contact line CL7, respectively.

The fifth wiring L5 is connected to the respective upper ends of the eighth contact line CL8 and the ninth contact line CL9. Consequently, the fifth wiring L5 connects the resistance line ReL4 to the resistance line ReL5 through the eighth contact line CL8 and the ninth contact line CL9, respectively.

The sixth wiring L6 is connected to the upper end of the tenth contact line CL10.

With this configuration, the first to sixth wirings L1 to L6 are connected in series to form one resistor element R. That is, this embodiment has such a configuration where the n+1th resistance line ReL from the bottommost one (where n is a natural number not less than 0) is connected to a first upper wiring layer and a second upper wiring layer, while the n+2th resistance line ReL from the bottommost one is connected to a second upper wiring layer and a third upper wiring layer.

Figure 17:
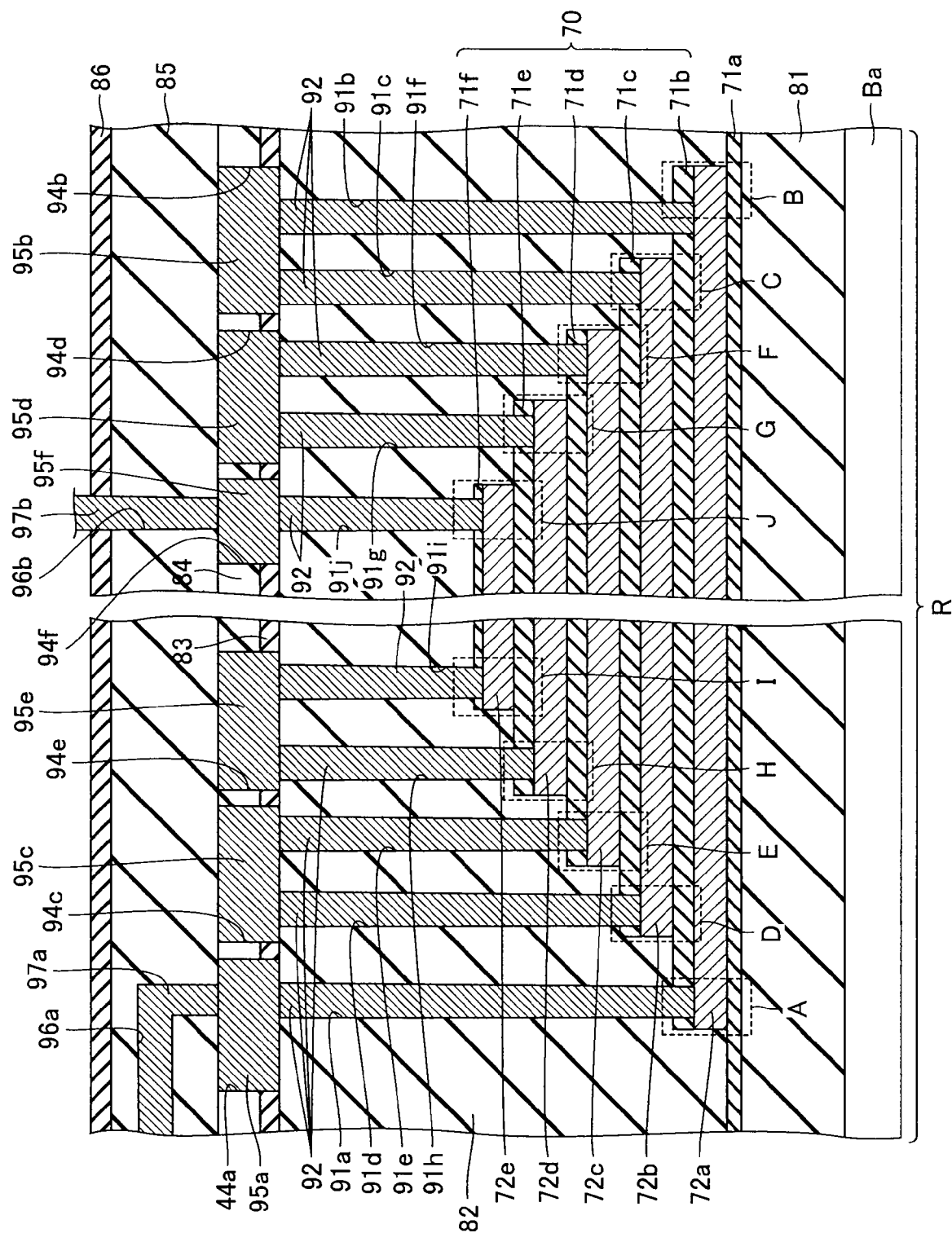
FIG. 17 is a cross-sectional view specifically illustrating the resistor element area 110 in the semiconductor storage device 100 according to the fourth embodiment.

Referring now to FIG. 17, a specific configuration of the resistor element area 110 will be described below.

As illustrated in FIG. 17, in the resistor element area 110, the semiconductor storage device 100 has, from lower layer to upper layer, a first insulation layer 81, a resistor element layer 70, and second to sixth insulation layers 82 to 86 on the semiconductor substrate Ba. The resistor element layer 70 is included in one resistor element R.

The first insulation layer 81 is composed of silicon oxide ($SiO_2$). The first insulation layer 81 is formed to the top surface of the source-side isolation and insulation layer 24 in the memory transistor area 12.

The resistor element layer 70 has first to sixth resistor element insulation layers 71a to 71f and first to fifth resistor element conductive layers (second conductive layers) 72a to 72e that are alternately laminated on the first insulation layer 81.

The second resistor element insulation layer 71b and the first resistor element conductive layer 72a are formed in line with each other at their row-direction ends. The third resistor element insulation layer 71c and the second resistor element conductive layer 72b are formed in line with each other at their row-direction ends. The fourth resistor element insulation layer 71d and the third resistor element conductive layer 72c are formed in line with each other at their row-direction ends. The fifth resistor element insulation layer 71e and the fourth resistor element conductive layer 72d are formed in line with each other at their row-direction ends. The sixth resistor element insulation layer 71f and the fifth resistor element conductive layer 72e are formed in line with each other at their row-direction ends. In addition, the second to sixth resistor element insulation layers 71b to 71f and the first to fifth resistor element conductive layers 72a to 72e are formed in a stepwise manner in relation to each other at their row-direction ends.

The first to sixth resistor element insulation layers 71a to 71f are composed of silicon oxide ($SiO_2$). The first to fifth resistor element conductive layers 72a to 72e are composed of polysilicon (p-Si).

Note that the first to sixth resistor element insulation layers 71a to 71f are formed in the same layer as the first to sixth inter-wordline insulation layers 31a to 31f. A material of the first to sixth resistor element insulation layers 71a to 71f may be the same as that of the first to fifth inter-wordline insulation layers 31a to 31e, both being formed in the same layer in the same step. Similarly, the first to fifth resistor element conductive layers 72a to 72e are also formed in the same layer as the first to fifth word-line conductive layers 32a to 32e. A material of the first to fifth resistor element conductive layers 72a to 72e may be the same as that of the first to fifth word-line conductive layers 32a to 32e, as both formed in the same layer in the same step.

The second insulation layer 82 is formed over the resistor element layer 70 to the top surface of the insulation layer 45. The third insulation layer 83 is formed on the second insulation layer 82 to the top surface of the wiring first insulation layer 51. The fourth insulation layer 84 is formed on the third insulation layer 83 to the top surface of the wiring second insulation layer 52. The fifth insulation layer 85 is formed on the fourth insulation layer 84 to the top surface of the wiring third insulation layer 53. The sixth insulation layer 86 is formed on the fifth insulation layer 85 to the top surface of the wiring fourth insulation layer 54.

Contact holes 91a to 91j are formed in the resistor element layer 70 and the second insulation layer 82. The contact hole 91a is formed to reach the end A of the first resistor element conductive layer 72a. The contact hole 91b is formed to reach the end B of the first resistor element conductive layer 72a. The contact hole 91c is formed to reach the end C of the second resistor element conductive layer 72b. The contact hole 91d is formed to reach the end D of the second resistor element conductive layer 72b. The contact hole 91e is formed to reach the end E of the third resistor element conductive layer 72c. The contact hole 91f is formed to reach the end F of the third resistor element conductive layer 72c. The contact hole 91g is formed to reach the end G of the fourth resistor element conductive layer 72d. The contact hole 91h is formed to reach the end H of the fourth resistor element conductive layer 72d. The contact hole 91i is formed to reach the end I of the fifth resistor element conductive layer 72e. The contact hole 91j is formed to reach the end J of the fifth resistor element conductive layer 72e.

The contact holes 91a to 91j have contact conductive layers (contact layers) 92 formed therein. The contact conductive layers 92 are composed of titanium/titanium nitride (Ti/TiN) and tungsten (W).

First to sixth wiring trenches 94a to 94f are formed in the second and third insulation layers 82 and 83. The first wiring trench 94a is formed above the contact hole 91a. The second wiring trench 94b is formed above the contact holes 91b and 91c. The third wiring trench 94c is formed above the contact holes 91d and 91e. The fourth wiring trench 94d is formed above the contact holes 91f and 91g. The fifth wiring trench 94e is formed above the contact holes 91h and 91i. The sixth wiring trench 94f is formed above the contact hole 91j.

The first to sixth wiring trenches 94a to 94f have first to sixth wiring conductive layers (upper wiring layers) 95a to 95f formed therein. The first to sixth wiring conductive layers 95a to 95f are composed of titanium/titanium nitride (Ti/TiN) and tungsten (W).

Contact holes 96a and 96b are formed in the fifth insulation layer 85. The contact hole 96a is formed above the first wiring conductive layer 95a. The contact hole 96b is formed above the sixth wiring conductive layer 95f.

The contact holes 96a and 96b have contact conductive layers 97a and 97b formed therein. The contact conductive layers 97a and 97b are composed of titanium/titanium nitride (Ti/TiN) and tungsten (W).

The first wiring conductive layer 95a and the sixth wiring conductive layer 95f are connected via the contact conductive layers 97a and 97b to peripheral circuits (not illustrated in FIG. 17) formed in an external device (not illustrated) or the semiconductor storage device 100.

With this configuration, the first to fifth resistor element conductive layers 72a to 72e are connected in series to form one resistor element R.

This means that the first to fifth resistor element conductive layers 72a to 72e function as the resistor element R between the external device (not illustrated) connected to one of the first wiring conductive layer 95a or the sixth wiring conductive layer 95f and the peripheral circuit (not illustrated in FIG. 17) connected to the first wiring conductive layer 95a or the sixth wiring conductive layer 95f.

Advantages of Semiconductor Storage Device 100 in the Embodiments

Advantages of the semiconductor storage device 100 according to the disclosed embodiments will be described below. The semiconductor storage device 100 of the embodiments may achieve high integration because of its lamination structure. In addition, according to the semiconductor storage device 100, each layer corresponding to respective memory transistors MTrmn, source-side selection transistors SSTrmn, and drain-side selection transistors SDTrmn may be manufactured in a predetermined number of lithography steps, irrespective of the number of laminated layers. That is, the semiconductor storage device 100 may be manufactured at a lower cost.

In addition, the semiconductor storage device 100 according to the embodiments of the present invention has a resistor element area 110. The resistor element area 110 includes the resistor element layer 70 formed in the same layer and same step as the memory transistor layer 30.

For example, using a configuration where word lines WL formed to expand in a two-dimensional manner in a horizontal direction parallel to the semiconductor substrate Ba are used as a resistor element R, the word lines WL must be elongated in a two-dimensional manner in order to increase their resistance due to their low resistance. In contrast, in the semiconductor storage device 100 according to the first embodiment, a resistor element R has a similar lamination structure to that of the memory transistor layer 30, which may reduce the occupation area and the number of steps required for formation.

According to the fourth embodiment, the memory strings MS may be formed in a linear manner as illustrated in FIG. 6, or in U-shape as illustrated in FIG. 12.

Figure 18:
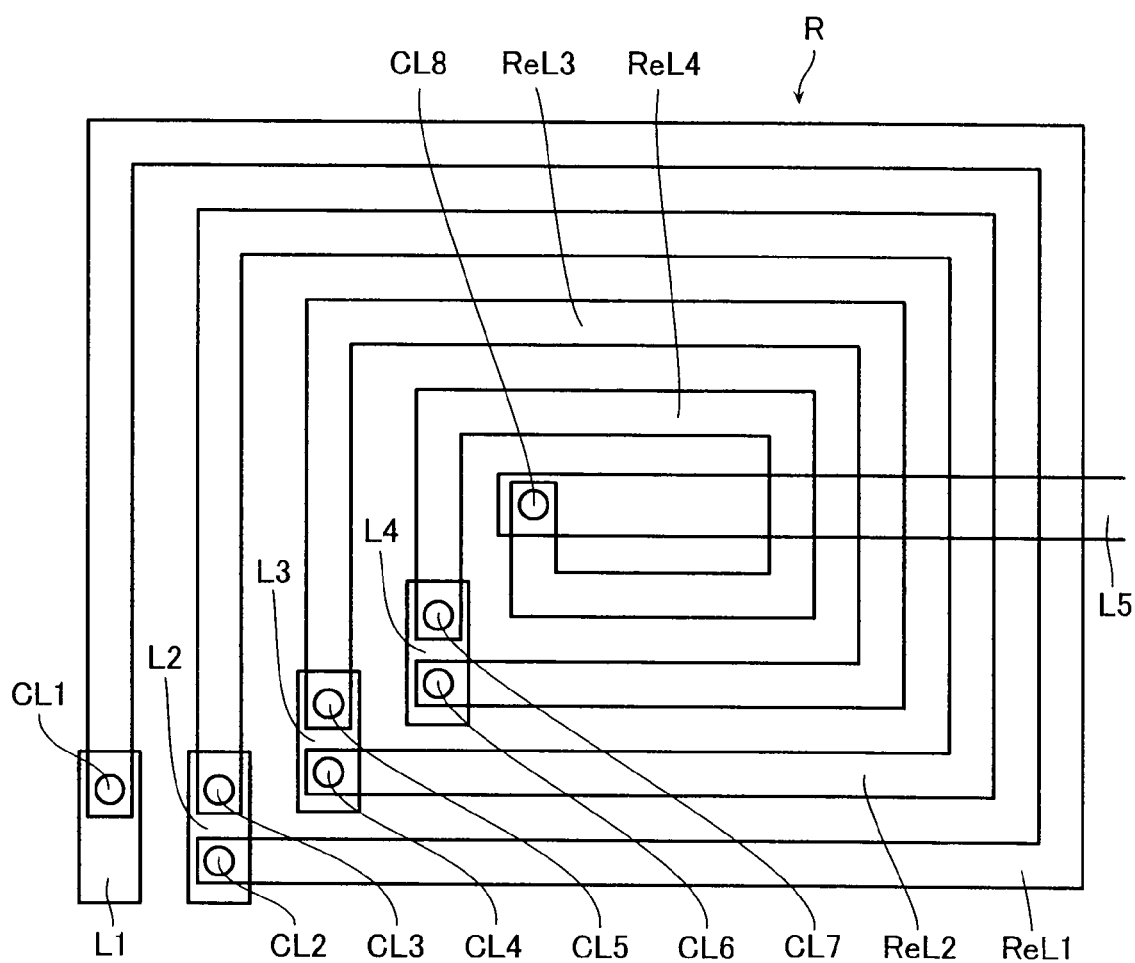
FIG. 18 illustrates another pattern of the resistor element area 110.

In addition, while the resistor element conductive layers 72 are formed in strip shape (stripe form) as illustrated in FIG. 16, they may be formed in a spiral form as illustrated in FIG. 18. It should be noted that other layers that are connected in series and laminated in a stepwise manner in relation to each other at their ends would still fall within the scope of the invention, irrespective of the internal shapes of the laminated resistor element conductive layers 72.

Figure 19:
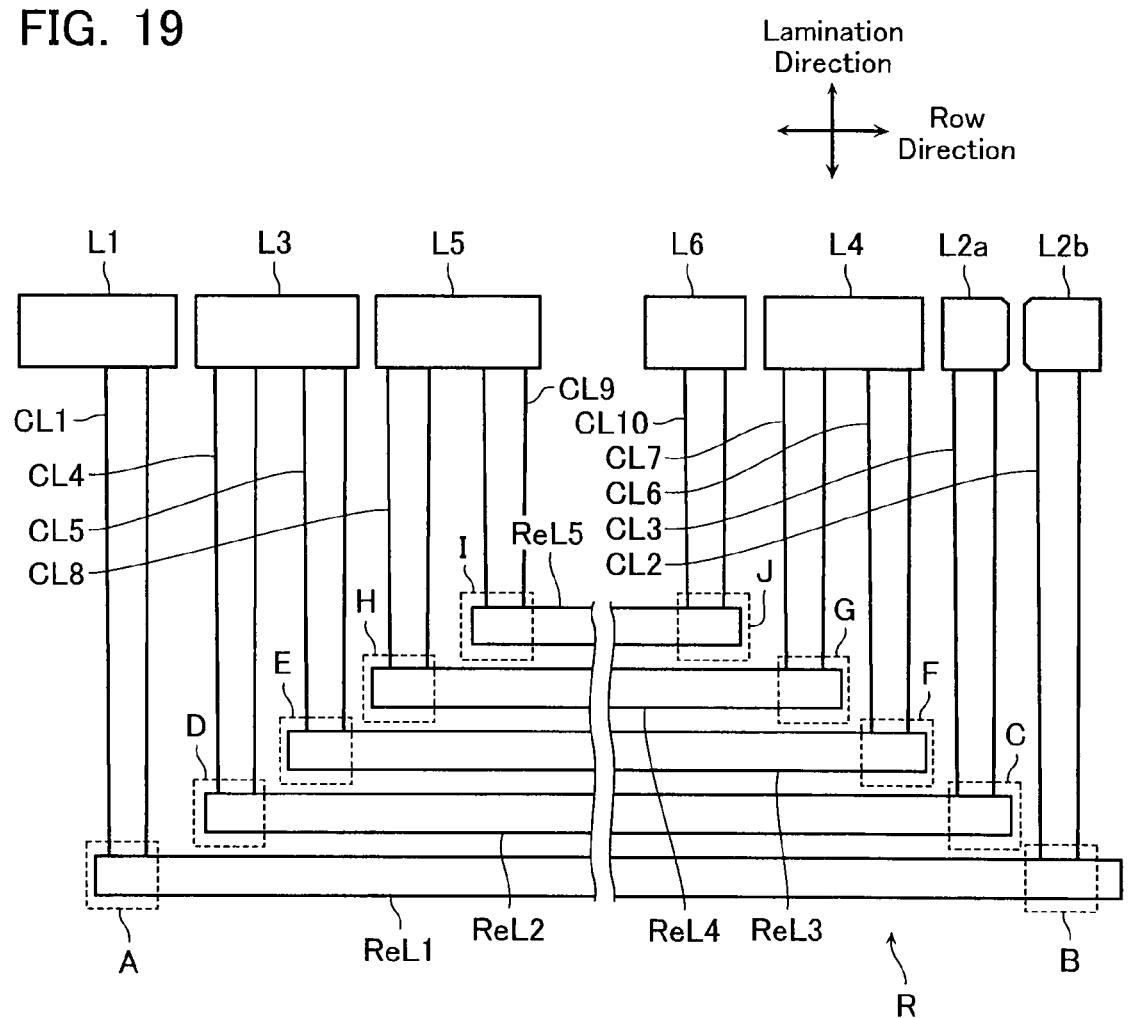
FIG. 19 illustrates a modified example of the resistor element area 110 in the semiconductor storage device 100 according to the fourth embodiment.

Also, as shown in FIG. 19, the resistance line ReL1 and the resistance line ReL2 may be connected to the different wirings L2a and L2b, respectively, via the second contact line CL2, third contact line CL3, respectively. These wirings L2a and L2b are formed of the same materials at the same time in the same layer. In this case, if the wiring L2a alone is connected to an external equipment or a peripheral circuit of the semiconductor storage device 100, the wiring L2b, the second contact line CL2, resistance line ReL1, the first contact line CL1 and the wiring L1 do not function as a resistor element. Thus, the resistance value of the resistance element can be changed by changing a layout of wiring L1–L2.

In addition, the resistance line ReL1-ReL5 (the resistor element conductive layer 72a-72e in FIG. 17) each have shorter length in the row direction as being in the upper layer. That is, a resistance value of the resistance line ReL5 is the smallest among the five resistance lines ReL1 to ReL5, and a resistance value thereof becomes larger as being in the lower layer (a resistance value of the resistance line ReL1 is the largest). Thus, these resistance lines ReL1-5 may be properly combined while some of them being not in use, so that a resistance value can be fine-tuned.

Fifth Embodiment

Figure 20:
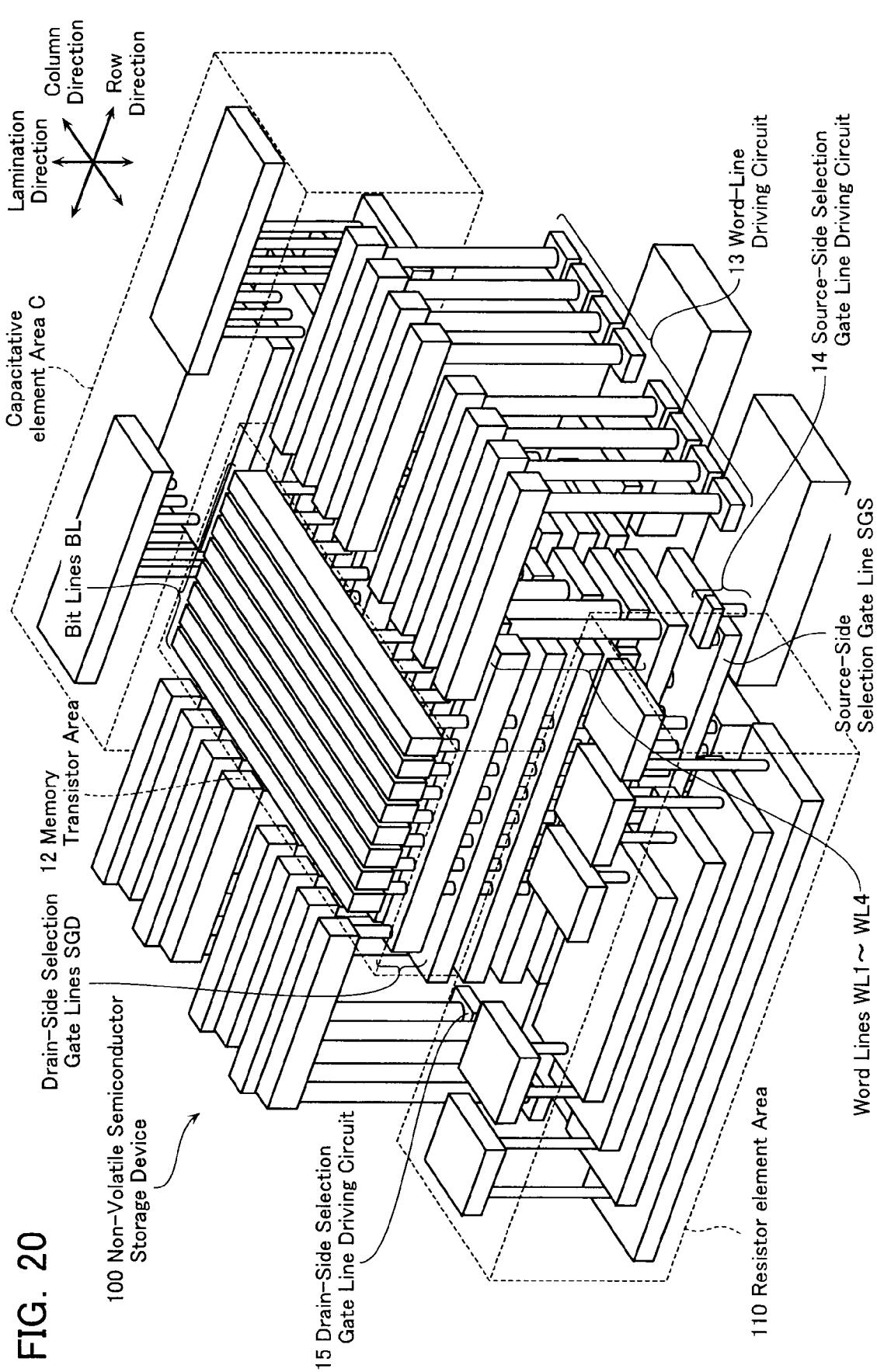
FIG. 20 illustrates a configuration of a semiconductor storage device 100 according to a fifth embodiment of the present invention.

Referring now to FIG. 20, the configuration of the nonvolatile semiconductor storage device according to the fifth embodiment of the present invention is described.

FIG. 20 is a schematic view of the nonvolatile semiconductor storage device according to the fifth embodiment.

As illustrated in FIG. 20, the non-volatile semiconductor storage device 100 according to the fifth embodiment mainly comprises: a memory transistor area 12; a word-line driving circuit 13; a source-side selection gate line (SGS) driving circuit 14; a drain-side selection gate line (SGD) driving circuit 15; a sense amplifier (not illustrated); and the like. Additionally, this device 100 includes both the resistor element area 110 and the capacitor element area C. The resistor element area 110 and the capacitor element area C may have the same configuration as the aforementioned embodiments (see FIG. 8, FIG. 13A, FIG. 13B, FIG. 17, and FIG. 19).

(Advantages of Non-Volatile Semiconductor Storage Device 100 in Fifth Embodiment)

Next, advantages of the non-volatile semiconductor storage device 100 according to the fifth embodiment will now be described below. The semiconductor storage device 100 according to the present embodiment has the capacitor element area C and the resistance element area 110. That is, it may be said that an advantages of the first to third embodiments as well as that of the fourth embodiment embodiment may be obtained through this fifth embodiment.

Others

As can be seen from the above, according to the embodiments of the present invention, capacitor elements or resistor elements are formed by conductive layers that are formed in the same layer as the word lines WL1 to WL4, as well as interlayer insulation films that are sandwiched between the conductive layers and formed in the same layer as interlayer insulation layers between the word lines WL1 to WL4. The capacitor elements may be formed by multiple conductive layers and interlayer insulation layers sandwiched therebetween. In addition, resistor elements may be formed by connecting the multiple conductive layers in series. In this way, the conductive layers formed in the same layer as the word lines WL1 to WL4 and the interlayer insulation layers sandwiched between the conductive layers may function as the capacitor element/resistor element area for forming capacitive or resistor elements.

What is claimed is:

1. A semiconductor storage device comprising a plurality of memory strings with a plurality of electrically rewritable memory cells connected in series, and a capacitor element area including a capacitor element,
   each of the memory strings comprising:
       a plurality of first conductive layers laminated on a substrate;
       a plurality of first interlayer insulation layers formed between the plurality of first conductive layers;

a semiconductor layer formed to penetrate the plurality of first conductive layers and the plurality of first interlayer insulation layers; and a charge accumulation layer formed between the first conductive layers and the semiconductor layer, the capacitor element area comprising:

a plurality of second conductive layers laminated on the substrate and formed in the same layer as the first conductive layers; and a plurality of second interlayer insulation layers formed between the plurality of second conductive layers and formed in the same layer as the first interlayer insulation layers, a group of the second conductive layers laminated adjacently to form two layers being connected to a first potential, while another group of the second conductive layers laminated adjacently to form two layers being connected to a second potential different from the first potential, and the second conductive layers laminated adjacently to form two layers and the second interlayer insulation layer between the second conductive layers configuring the capacitor element.

2. The semiconductor storage device according to claim 1, comprising:

contact layers formed to be connected to respective ends of the second conductive layers and extend in a lamination direction, wherein the plurality of first conductive layers and the plurality of second conductive layers are formed in a stepwise manner in relation to each other at their ends, and the contact layers are connected to the first potential or the second potential.

3. The semiconductor storage device according to claim 1, wherein an n+1th second conductive layer from the bottommost one (where n is a natural number not less than 0) is connected to the first potential, and an n+2th second conductive layer from the bottommost one is connected to the second potential.

4. The semiconductor storage device according to claim 3, comprising:

contact layers formed to be connected to respective ends of the second conductive layers and extend in a lamination direction, wherein the plurality of first conductive layers and the plurality of second conductive layers are formed in a stepwise manner in relation to each other at their ends, and the contact layers are connected to the first potential or the second potential.

5. The semiconductor storage device according to claim 1, wherein an 3n+1th second conductive layer from the bottommost one (where n is a natural number not less than 0) is connected to the first potential, and an 3n+2th and 3n+3th second conductive layers from the bottommost one are connected to the second potential.

6. The semiconductor storage device according to claim 5, comprising:

contact layers formed to be connected to respective ends of the second conductive layers and extend in a lamination direction, wherein the plurality of first conductive layers and the plurality of second conductive layers are formed in a stepwise manner in relation to each other at their ends, and the contact layers are connected to the first potential or the second potential.

7. The semiconductor storage device according to claim 1, wherein the first conductive layers and the second conductive layers are formed of the same material, and the first interlayer insulation layers and the second interlayer insulation layers are formed of the same material.

8. The semiconductor storage device according to claim 1, wherein the second conductive layers have the respective ends coincident with those of the second interlayer insulation layers formed on the second conductive layers.

9. A semiconductor storage device comprising a plurality of memory strings with a plurality of electrically rewritable memory cells connected in series, and a resistor element area including a resistor element, each of the memory strings comprising:

a plurality of first conductive layers laminated on a substrate;

a plurality of interlayer insulation layers formed between the plurality of first conductive layers;

a semiconductor layer formed to penetrate the plurality of first conductive layers and the plurality of interlayer insulation layers; and a charge accumulation layer formed between the first conductive layers and the semiconductor layer, the resistor element area comprising a plurality of second conductive layers laminated on the substrate and formed in the same layer as the first conductive layers, and at least two layers of the plurality of second conductive layers being connected in series to configure the resistor element.

10. The semiconductor storage device according to claim 9, comprising:

a plurality of contact layers formed to be connected to ends of the second conductive layers and extend in a lamination direction, wherein the plurality of first conductive layers and the plurality of second conductive layers are formed in a stepwise manner in relation to each other at their ends, and the plurality of contact layers are connected to a plurality of upper wiring layers formed on the second conductive layers.

11. The semiconductor storage device according to claim 10, wherein an n+1th second conductive layer from the bottommost one (where n is a natural number not less than 0) is connected to a first upper wiring layer and a second upper wiring layer among the upper wiring layers, and an n+2th second conductive layer from the bottommost one is connected to the second upper wiring layer and a third upper wiring layer among the upper wiring layers.

12. The semiconductor storage device according to claim 9, wherein the second conductive layers are formed by the same material as the first conductive layers.

13. The semiconductor storage device according to claim 9, wherein the second conductive layers are formed in strip shape.

14. A semiconductor storage device comprising a plurality of memory strings with a plurality of electrically rewritable memory cells connected in series, and a capacitor/resistor element area including a capacitor element or a resistor element, each of the memory strings comprising:

a plurality of first conductive layers laminated on a substrate;

a plurality of first interlayer insulation layers formed between the plurality of first conductive layers;

a semiconductor layer formed to penetrate the plurality of first conductive layers and the plurality of first interlayer insulation layers; and a charge accumulation layer formed between the first conductive layers and the semiconductor layer, the capacitor/resistor element area comprising:

a plurality of second conductive layers laminated on the substrate and formed in the same layer as the first conductive layers; and a plurality of second interlayer insulation layers formed between the plurality of second conductive layers and formed in the same layer as the first interlayer insulation layers.

15. The semiconductor storage device according to claim 14, comprising:

contact layers formed to be connected to respective ends of the second conductive layers and extend in a lamination direction, wherein the plurality of first conductive layers and the plurality of second conductive layers are formed in a stepwise manner in relation to each other at their ends.

16. The semiconductor storage device according to claim 14, wherein the second conductive layers are formed by the same material as the first conductive layers.

17. The semiconductor storage device according to claim 14, wherein the first conductive layers and the second conductive layers are formed of the same material, and the first interlayer insulation layers and the second interlayer insulation layers are formed of the same material.

18. The semiconductor storage device according to claim 14, wherein the second conductive layers have the respective ends coincident with those of the second interlayer insulation layers formed on the second conductive layers.

* * * * *